US011557562B2

(12) United States Patent
Miyake et al.

(10) Patent No.: US 11,557,562 B2
(45) Date of Patent: Jan. 17, 2023

(54) ANISOTROPIC CONDUCTIVE FILM

(71) Applicant: DEXERIALS CORPORATION, Tokyo (JP)

(72) Inventors: Takeshi Miyake, Oyama (JP); Reiji Tsukao, Utsunomiya (JP); Tatsurou Fukaya, Oyama (JP)

(73) Assignee: DEXERIALS CORPORATION, Tokyo (JP)

( * ) Notice: Subject to any disclaimer, the term of this patent is extended or adjusted under 35 U.S.C. 154(b) by 272 days.

(21) Appl. No.: 16/343,380

(22) PCT Filed: Oct. 18, 2017

(86) PCT No.: PCT/JP2017/037664
§ 371 (c)(1),
(2) Date: Apr. 18, 2019

(87) PCT Pub. No.: WO2018/079365
PCT Pub. Date: May 3, 2018

(65) Prior Publication Data
US 2019/0319003 A1 Oct. 17, 2019

(30) Foreign Application Priority Data
Oct. 24, 2016 (JP) .............................. JP2016-208086
Aug. 23, 2017 (JP) .............................. JP2017-160657

(51) Int. Cl.
*H01L 23/00* (2006.01)
*C09J 7/30* (2018.01)
(Continued)

(52) U.S. Cl.
CPC ............... *H01L 24/29* (2013.01); *C09J 5/00* (2013.01); *C09J 7/30* (2018.01); *C09J 9/02* (2013.01);
(Continued)

(58) Field of Classification Search
CPC ... H01L 24/29; H01L 24/83; H01L 2224/292; H01L 2224/29386; H01L 2224/83851;
(Continued)

(56) References Cited

U.S. PATENT DOCUMENTS

| 4,999,460 A | 3/1991 | Sugiyama et al. | |
| 2014/0001419 A1* | 1/2014 | Namiki | H01B 1/22 252/513 |
| 2015/0231803 A1* | 8/2015 | Shinohara | B29D 7/01 438/119 |

FOREIGN PATENT DOCUMENTS

| JP | H03-071570 A | 3/1991 |
| JP | H03-112011 A | 5/1991 |

(Continued)

OTHER PUBLICATIONS

May 22, 2020 Office Action issued in Chinese Patent Application No. 201780062727.4.
(Continued)

*Primary Examiner* — Mohammad M Choudhry
(74) *Attorney, Agent, or Firm* — Oliff PLC

(57) ABSTRACT

An anisotropic conductive film can reduce the conduction resistance of an anisotropic conductively connected connection structure, and can reliably suppress the occurrence of short-circuits. The film has a structure wherein insulating particle-including conductive particles, wherein insulating particles adhere to the surfaces of conductive particles, are distributed throughout an insulating resin layer. In the insulating particle-including conductive particles, a number of insulating particles in contact with the conductive particles with respect to a film thickness direction is lower than with respect to a film planar direction. Preferably, a number of the insulating particles overlapping with the conductive particles when one of a front and rear film surface of the anisotropic conductive film is viewed in plan view is lower (Continued)

than a number of the insulating particles overlapping with the conductive particles when the other of the film surfaces is viewed in plan view.

13 Claims, 5 Drawing Sheets

(51) Int. Cl.
*C09J 5/00* (2006.01)
*C09J 9/02* (2006.01)

(52) U.S. Cl.
CPC ......... *H01L 24/83* (2013.01); *C09J 2203/326* (2013.01); *C09J 2461/00* (2013.01); *C09J 2463/00* (2013.01); *H01L 2224/292* (2013.01); *H01L 2224/29286* (2013.01); *H01L 2224/83851* (2013.01)

(58) Field of Classification Search
CPC ......... C09J 7/30; C09J 5/00; C09J 9/02; C09J 2203/326; C09J 2461/00; C09J 2463/00
See application file for complete search history.

(56) References Cited

FOREIGN PATENT DOCUMENTS

| JP | H06-013432 A | 1/1994 |
| JP | 2009-280790 A | 12/2009 |
| JP | 2014-132567 A | 7/2014 |
| JP | 2015-201435 A | 11/2015 |
| JP | 2016-131082 A | 7/2016 |
| JP | 2018-73808 A | 5/2018 |
| KR | 10-2008-0058610 A | 6/2008 |

OTHER PUBLICATIONS

Jan. 9, 2018 International Search Report issued in International Patent Application No. PCT/JP2017/037664.
Apr. 30, 2019 International Preliminary Report on Patentability issued in International Patent Application No. PCT/JP2017/037664.
Jul. 14, 2021 Office Action issued in Taiwanese Application No. 106136139.
Jul. 26, 2022 Office Action issued in Japanese Application No. 2021-138219.
Sep. 5, 2022 Office Action issued in Chinese Application No. 202110420313.2.

* cited by examiner (X-X CROSS-SECTIONAL VIEW)

ANISOTROPIC CONDUCTIVE FILM

TECHNICAL FIELD

The present invention relates to an anisotropic conductive film.

BACKGROUND ART

Anisotropic conductive films are widely used for mounting electronic components such as IC chips. In anisotropic conductive films, conductive particles are dispersed throughout an insulating resin layer of the film at a high density to enable application of anisotropic conductive films to high density mounting. However, increasing the density of the conductive particles may cause short circuits.

In response, using insulating particle-including conductive particles, in which insulating particles are caused to adhere to the surfaces of conductive particles, has been proposed instead of using past conductive particles (Patent Document 1). The insulating particle-including conductive particles are kneaded with a binder resin using a mixer and turned into a film in order to obtain an anisotropic conductive film.

CITATION LIST

Patent Literature

Patent Document 1: JP 2014-132567 A

SUMMARY OF INVENTION

Technical Problem

However, when insulating particle-including conductive particles are kneaded with a binder resin using a mixer as disclosed in Patent Document 1, the insulating particles may become isolated from the conductive particles, making it impossible to achieve the intended insulating properties of the insulating particle-including conductive particles. There is thus a risk of short circuits occurring in the connection structure of an electronic component anisotropic conductively connected using an anisotropic conductive film in which insulating particle-including conductive particles are dispersed at high density throughout a binder resin.

Furthermore, in an anisotropic conductive connection using this anisotropic conductive film, when the insulating particle-including conductive particles are pressed against a terminal of the electronic component, both the conductive particles and the insulating particles are pressed against the terminal. Thus, there arises a problem that it is easy for the connection structure to experience an increased conduction resistance.

Accordingly, the present invention provides an anisotropic conductive film which uses insulating particle-including conductive particles, the anisotropic conductive film being capable of reducing the conduction resistance of a connection structure having an anisotropic conductive connection and of reliably suppressing the occurrence of short circuits.

Solution to Problem

The inventors of the present invention found that when manufacturing an anisotropic conductive film using insulating particle-including conductive particles in which insulating particles adhere substantially uniformly to the entire surfaces of conductive particles, in the insulating particle-including conductive particles, the number of insulating particles adhering to the conductive particles with respect to a film planar direction is maintained. However, the inventors also discovered that in an attempt made to reduce the number of insulating particles adhering to the conductive particles with respect to a film thickness direction, it is easier, in an anisotropic conductive connection that uses the anisotropic conductive film, for the conductive particles to be compressed against terminal surfaces directly instead of over the insulating particles, and the conduction resistance of the connection structure can therefore be reduced. The inventors also found that it is difficult for short-circuits to occur due to the presence of the insulating particles between adjacent terminals. In light of such discoveries, the inventors arrived at the present invention.

That is, the present invention provides an anisotropic conductive film having insulating particle-including conductive particles, in which insulating particles adhere to the surfaces of conductive particles, the insulating particle-including conductive particles being dispersed throughout an insulating resin layer, wherein in the insulating particle-including conductive particles, a number of the insulating particles in contact with the conductive particles with respect to a film thickness direction is lower than a number of the insulating particles in contact with the conductive particles with respect to a film planar direction.

The present invention also provides a method for manufacturing a connection structure in which electronic components are anisotropic conductively connected using the above-described anisotropic conductive film, as well as a connection structure obtained through the method.

Advantageous Effects of Invention

According to the anisotropic conductive film of the present invention, in the original insulating particle-including conductive particles in which the insulating particles adhere substantially uniformly to the entire surfaces of the conductive particles, the number of insulating particles in contact with the conductive particles with respect to the film thickness direction is lower than the number of the insulating particles in contact with the conductive particles with respect to the film planar direction. Accordingly, when the terminals of electronic components are anisotropic conductively connected using the anisotropic conductive film, the surface area of direct contact between the terminals and the conductive particles is greater than when the original state of the insulating particle-including conductive particles is maintained. As such, the conduction resistance in the connection structure can be reduced. Additionally, according to this anisotropic conductive film, the original state of the insulating particle-including conductive particles is maintained with respect to the number of insulating particles in contact with the conductive particles with respect to the film planar direction, and thus the occurrence of short circuits between adjacent terminals can be suppressed in the connection structure.

DESCRIPTION OF EMBODIMENTS

Figure 1A:
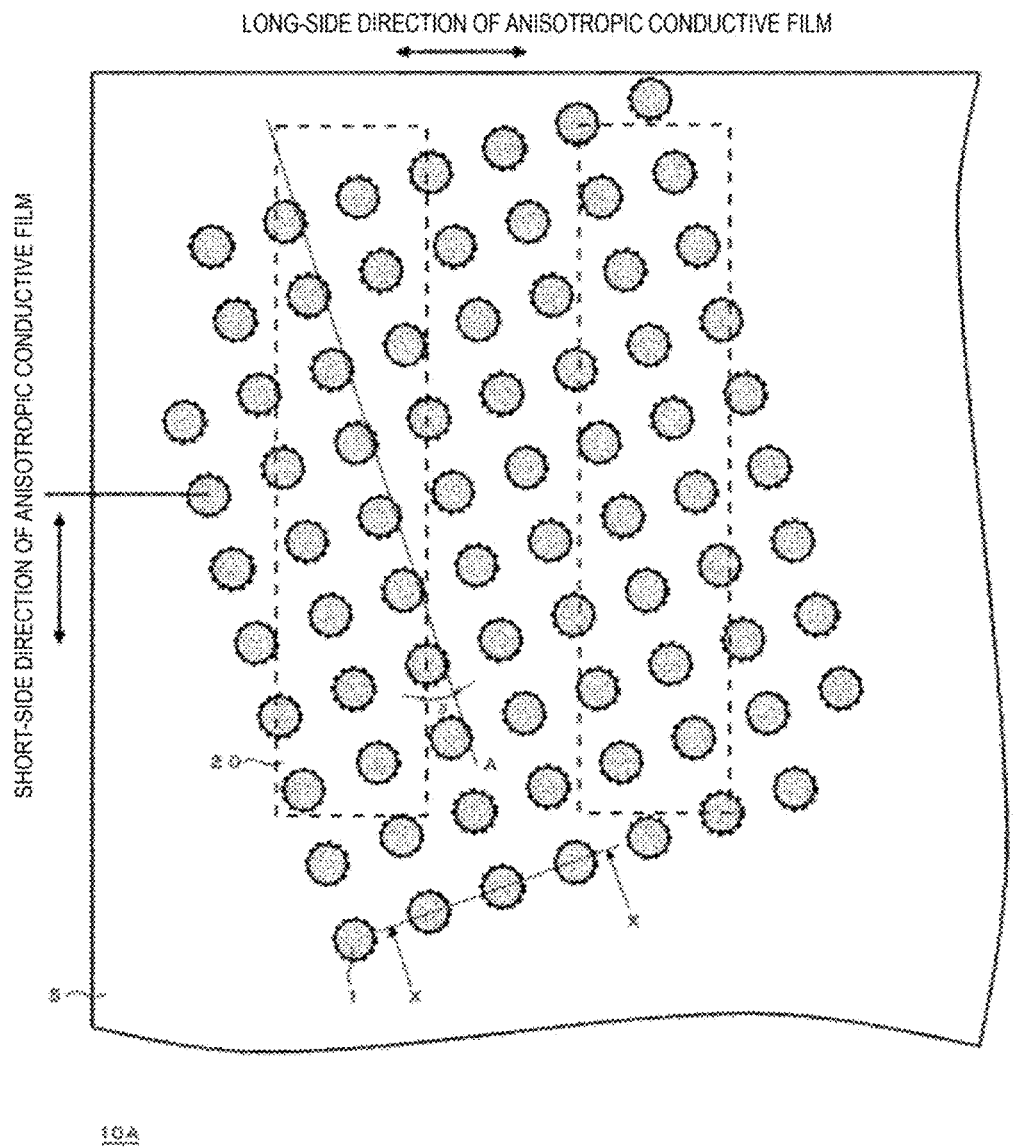
FIG. 1A is a plan view illustrating the disposition of conductive particles in an anisotropic conductive film 10A of examples.

An example of an anisotropic conductive film of the present invention will be described below in detail with reference to the drawings. Note that in the drawings, identical reference signs indicate the same or equivalent constituents.

Overall Configuration of Anisotropic Conductive Film

Figure 1B:
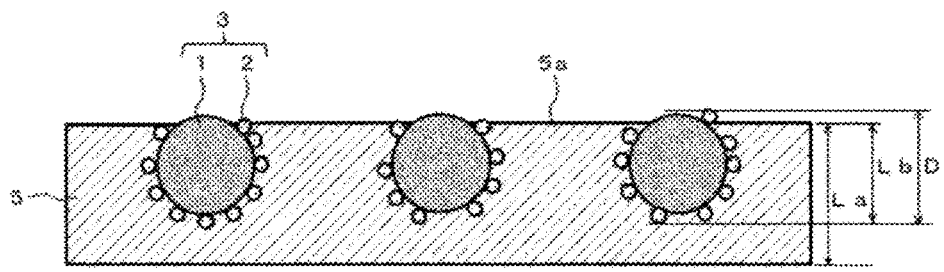
FIG. 1B is a cross-sectional view of the anisotropic conductive film 10A of the examples.

FIG. 1A is a plan view illustrating the disposition of conductive particles in an anisotropic conductive film 10A of an example of the present invention, and FIG. 1B is an X-X cross-sectional view thereof.

The anisotropic conductive film 10A has a structure in which insulating particle-including conductive particles 3, in each of which insulating particles 2 are in contact with or adhere to the surface of a conductive particle 1, are embedded in one surface of an insulating resin layer 5. When the film is viewed in plan view, the insulating particle-including conductive particles 3 are distributed without being in contact with each other. The insulating particle-including conductive particles 3 are furthermore distributed so as not to overlap with each other with respect to the film thickness direction. The insulating particle-including conductive particles 3 are in the same position with respect to the film thickness direction (the vertical direction as seen in FIG. 1B), and the insulating particle-including conductive particles 3 therefore form a single layer in the film planar direction (the horizontal direction in FIG. 1B).

The anisotropic conductive film 10A of the present invention is characteristic in terms of the disposition of the insulating particles 2 in the insulating particle-including conductive particles 3. As will be described in detail later, the number of insulating particles 2 in contact with conductive particles 1 with respect to the film thickness direction is lower than the number of insulating particles 2 in contact with the conductive particles 1 with respect to the film planar direction.

Insulating Particle-Including Conductive Particle

In the anisotropic conductive film 10A of the present invention, the number of insulating particles 2 in an insulating particle-including conductive particle 3 is lower with respect to the film thickness direction of the conductive particle 1 than with respect to the film planar direction of the conductive particle. However, particles in which the insulating particles 2 adhere to the entire surface of the conductive particle 1 in a substantially uniform manner can be used as the insulating particle-including conductive particles 3 serving as the raw material for manufacturing the anisotropic conductive film 10A of the present invention.

The particles disclosed in JP 2009-280790 A, JP 2014-132567 A, or the like can be used as such insulating particle-including conductive particles.

The particle diameter of the conductive particles 1 is preferably greater than or equal to 1 μm and less than or equal to 30 μm, more preferably greater than or equal to 2.5 μm and less than or equal to 13 μm, and still more preferably greater than or equal to 3 μm and less than or equal to 10 μm. This is to accommodate variations in the height of wiring, suppress an increase in conduction resistance, and suppress the occurrence of short circuits.

The particle diameter of the insulating particles 2 is lower than the particle diameter of the conductive particles 1. The specific particle diameter of the insulating particles 2 can be determined in accordance with the particle diameter of the conductive particles 1, the purpose for which the anisotropic conductive film will be used, and the like. Normally, however, the particle diameter of the insulating particles 2 is preferably greater than or equal to 0.005 μm and less than or equal to 5 μm, more preferably greater than or equal to 0.01 μm and less than or equal to 2.5 μm, still more preferably less than or equal to 1 μm, and particularly preferably less than or equal to 0.5 μm. This makes it unnecessary to excessively raise the pressure and temperature required when making an anisotropic conductive connection. For example, in a case where the insulating particles have too small a particle diameter compared to the conductive particles, the insulating particles will not effectively contribute to the insulating properties. As such, a lower limit of the particle diameter of the insulating particles is preferably greater than or equal to 0.4%, more preferably greater than or equal to 0.6%, and still more preferably greater than or equal to 0.8% of the particle diameter of the conductive particles. On the other hand, in a case where the upper limit is too high, there is a possibility that the insulating particles will not adhere sufficiently to the conductive particles or the number of insulating particles will be insufficient. As such, the upper limit is preferably less than or equal to 18%, more preferably less than or equal to 12%, and still more preferably less than or equal to 6%.

The particle diameters of the conductive particles 1, the insulating particles 2, and the insulating particle-including conductive particles 3 can be measured by distributing those particles on glass and observing the particles through an optical microscope, a metallurgical microscope, a transmission electron microscope (TEM), a scanning electron microscope (SEM), or the like. The diameters of the particles within the film can also be found by observation through a scanning electron microscope. When measuring the particle diameters, it is desirable that 300 samples or more are used in the measurement. The particle diameters of relatively small individual insulating particles can be measured accurately through a transmission electron microscope, whereas a scanning electron microscope is suited to finding the particle diameter of the insulating particle-including conductive particles 3 in particular.

The average particle diameter of individual conductive particles can be measured using a typical particle size distribution analyzer. The analyzer may be an imaging type or a laser type. The flow particle image analyzer FPIA-3000 (available from Malvern Panalytical Ltd.) can be given as an example of an imaging-type measurement device. Preferably, 1000 samples (the number of conductive particles) or more are used to measure a particle diameter D of the insulating particle-including conductive particles. The particle diameter D of the insulating particle-including conductive particles in the anisotropic conductive film can be found by observation through an electron microscope such as a SEM. In this case, it is desirable that 300 samples (the number of conductive particles) or more be used to measure the particle diameter D of the insulating particle-including conductive particles.

In the insulating particle-including conductive particles 3 used as the raw material for manufacturing the anisotropic conductive film 10A, the percentage of the surface of the conductive particle 1 covered by the insulating particles 2 (i.e., the coverage rate) is preferably from 20 to 97%, and more preferably from 40 to 95%. Short circuits are more likely to occur in a case where the coverage rate is too low, whereas the capture of conductive particles by bumps will be inhibited if the coverage rate is too high.

Note that the coverage rate is the ratio of the surface area (projected surface area) covered by the insulating particles to the entire surface of the insulating particle-including conductive particle. Observing 100 insulating particle-including conductive particles 3 using a scanning electron microscope and averaging the coverage rate across observed images is a specific example of a way to find the coverage rate. As a simple way to find the coverage rate, the number of insulating particles per single insulating particle-including conductive particle may be measured in each observation image, and the coverage rate may then be calculated from that numerical value, the projected surface area of a single insulating particle-including conductive particle, and the projected surface area of a single insulating particle. Here, in a case where an observation image of an insulating particle partially overlaps with a circular observation image of a conductive particle, that partially-overlapping insulating particle may be calculated as 0.5 particles.

Figure 2:
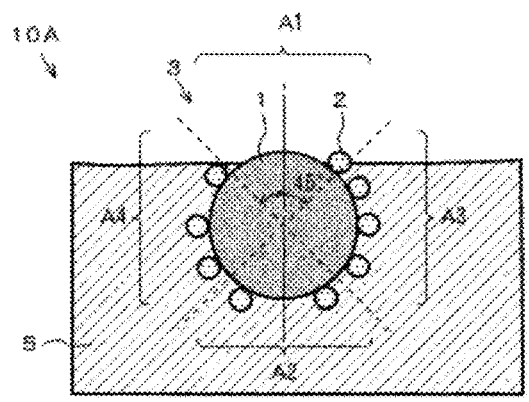
FIG. 2 is a diagram illustrating a method for measuring a number of insulating particles in contact with the surface of a conductive particle with respect to a film thickness direction or a film planar direction.

On the other hand, in the insulating particle-including conductive particles 3 that actually constitute the anisotropic conductive film 10A, the number of insulating particles 2 in contact with the conductive particles 1 with respect to the film thickness direction is lower than the number of insulating particles 2 in contact with the conductive particles 1 with respect to the film planar direction. Here, assume that, in a cross section of the anisotropic conductive film 10A taken in the film thickness direction of the insulating particle-including conductive particles 3, the insulating particle-including conductive particle 3 has been divided into four areas A1, A2, A3, and A4 by straight lines that pass through the center of the conductive particle 1 and are angled at +45° and −45°, respectively, relative to the film thickness direction as indicated in FIG. 2. In this case, the "number of insulating particles 2 in contact with the conductive particles 1 with respect to the film thickness direction" refers to the number of the insulating particles 2 present in the areas A1 and A2, which are above and below the conductive particle 1 (regions following the film surface). The "number of insulating particles 2 in contact with the conductive particles 1 with respect to the film planar direction" refers to the number of insulating particles 2 present in the areas A3 and A4, which of the above-described four areas A1, A2, A3, and A4 are on the left and right of the conductive particle 1 (in areas following the film thickness direction). Accordingly, in a case where the number of insulating particles 2 present in the areas A1, A2, A3, and A4 are taken as $N_{A1}$, $N_{A2}$, $N_{A3}$, and $N_{A4}$, respectively, $(N_{A3}+N_{A4})>(N_{A1}+N_{A2})$ holds true in the present invention. Note that the "cross section taken in the film thickness direction" preferably includes a plurality of different directions in the same film (i.e., cross-sectional views can be confirmed in different directions), and two cross sections at 90° are preferably included.

When finding the number of the insulating particles 2 present in the areas A1, A2, A3, and A4, in a case where an insulating particle 2 spans the upper and lower areas A1 and A2 and the left and right areas A3 and A4 of the conductive particle 1, the area which that insulating particle 2 is assigned to is determined on the basis of which area the insulating particle 2 occupies the most.

In the present invention, it is not necessary for all of the insulating particle-including conductive particles 3 to satisfy the above-described inequality. The number of insulating particles 2 present in the areas A1, A2, A3, and A4 may vary between individual insulating particle-including conductive particles 3, and insulating particle-including conductive particles 3 that do not satisfy the above-described inequality may be present. However, the above-described inequality is satisfied by finding the average of all of the insulating particle-including conductive particles 3 in the anisotropic conductive film, with $N_{A3}$ and $N_{A4}$ having a higher number than $N_{A1}$ and $N_{A2}$.

It is unrealistic to confirm whether all of the insulating particle-including conductive particles 3 present in the anisotropic conductive film satisfy the above-described inequality. As such, the number of insulating particles 2 present in the areas A1, A2, A3, and A4 are measured as described below, and in a case where the above-described inequality is satisfied, it may be assumed that the relationship indicated by the above-described inequality is satisfied in terms of the average of all of the insulating particle-including conductive particles.

In other words, when measuring the numbers of insulating particles 2 present in the areas A1, A2, A3, and A4 for each of the individual insulating particle-including conductive particles 3 by observing a cross section of the anisotropic conductive film 10A using a scanning electron microscope, a rectangular measurement area in which a single side is greater than or equal to 100 μm is set in a plurality of locations (preferably five locations or more, and more preferably ten locations or more) so as to be separated from each other, which provides a total surface area of greater than or equal to 1 mm². 100 insulating particle-including conductive particles 3 taken from the measurement areas are observed, and the number of insulating particles 2 present in the areas A1 and A2, and the number of insulating particles 2 present in the areas A3 and A4, are found for each of the insulating particle-including conductive particles 3. The average is taken for the 100 insulating particle-including conductive particles, and the number of insulating particles 2 in contact with the conductive particles 1 with respect to the film thickness direction ($N_{A1}+N_{A2}$) and the number of insulating particles 2 in contact with the conductive particles 1 with respect to the film planar direction ($N_{A3}+N_{A4}$) are found to determine whether the above-described inequality is satisfied. The measurement area may be adjusted as appropriate in accordance with the size of the conductive particle.

The following method may be used as a method for easily confirming whether the number of insulating particles 2 in contact with the conductive particles 1 with respect to the film thickness direction ($N_{A1}+N_{A2}$) is lower than the number of insulating particles 2 in contact with the conductive particles 1 with respect to the film planar direction ($N_{A3}+N_{A4}$). First, a measurement area with a surface area greater than or equal to 1 mm$^2$ is set, and it is confirmed whether the number of insulating particles 2 overlapping with the conductive particle 1 when one of a front or rear surface of the anisotropic conductive film is viewed in plan view is lower than the number of insulating particles 2 overlapping with the conductive particle 1 when the other of the front or rear surface of the anisotropic conductive film is viewed in plan view. When, during the manufacture of the anisotropic conductive film of the present invention, the insulating particle-including conductive particles are pushed into an insulating resin layer (described later), the following holds true: $N_{A3}$, $N_{A4} \geq N_{A2} > N_{A1}$ Accordingly, confirming that $N_{A2}>N_{A1}$ makes it possible to confirm that the number of insulating particles 2 in contact with the conductive particles 1 with respect to the film thickness direction ($N_{A1}+N_{A2}$) is lower than the number of insulating particles 2 in contact with the conductive particles 1 with respect to the film planar direction ($N_{A3}+N_{A4}$).

Note that the differences in numbers of insulating particles 2 among the areas A1, A2, A3, and A4 arise when a transfer mold is used to dispose the insulating particle-including conductive particles 3 in a prescribed arrangement in the method for manufacturing the anisotropic conductive film 10A, which will be described later. In other words, the differences in the numbers of insulating particles 2 arise due to the following situations. First, when the insulating particle-including conductive particles 3 are transferred from a transfer mold to an insulating resin layer, the insulating particles 2 in contact with the conductive particles 1 with respect to the film thickness direction (the insulating particles 2 in the area A1) easily separate from the conductive particles 1 and remain in the transfer mold due to friction with the transfer mold or friction with a pressurizing component. Alternatively, even if the insulating particle-including conductive particles 3 are transferred from the transfer mold to the insulating resin layer, the insulating particles 2 in contact with the conductive particles 1 with respect to the film thickness direction may move to locations where the insulating particles 2 are in contact with the conductive particles 1 with respect to the film planar direction, but the insulating particles 2 in contact with the conductive particles 1 with respect to the film planar direction will not easily separate or move from the conductive particles 1.

State of Distribution of Insulating Particle-Including Conductive Particles

The state of distribution of the insulating particle-including conductive particles in the present invention includes a state in which the insulating particle-including conductive particles 3 are distributed at random and a state in which the insulating particle-including conductive particles 3 are distributed in a regular disposition. In these states of distribution, the insulating particle-including conductive particles are preferably disposed so as not to be in contact with each other. The particle percentage is preferably greater than or equal to 95%, more preferably greater than or equal to 98%, and still more preferably greater than or equal to 99.5%.

With respect to the particle percentage, insulating particle-including conductive particles that are intentionally in a state of contact in the regularly-disposed state of distribution are counted as a single particle. As with the method for finding the area occupancy ratio of the insulating particle-including conductive particles when the film is viewed in plan view (described later), the particle percentage can be found assuming N=200 or more. In either case, it is preferable, from the standpoint of the capturing stability, that the positions of the particles be uniform with respect to the film thickness direction. Here, the positions of the conductive particles 1 being "uniform with respect to the film thickness direction" is not limited to being at a single depth with respect to the film thickness direction, and also includes a state in which conductive particles are present at the front and rear boundaries of the insulating resin layer 5 or in the vicinity thereof.

As described earlier, in the present invention, the insulating particle-including conductive particles 3 are preferably arranged regularly when the film is viewed in plan view. For example, a square lattice arrangement can be used, as illustrated in FIG. 1A. Other examples of a regular disposition of the insulating particle-including conductive particles include lattice arrangements such as a rectangular lattice, a rhombic lattice, or a hexagonal lattice. The regular arrangement is not limited to a lattice arrangement. For example, rows of particles in which insulating particle-including conductive particles are arranged linearly at a prescribed spacing may be arranged at a prescribed spacing. Disposing the insulating particle-including conductive particles 3 in a regular arrangement such as a lattice form, with the particles disposed so as not to be in contact with each other, not only ensures that a uniform pressure is applied to each insulating particle-including conductive particle 3 when making an anisotropic conductive connection, but also makes it possible to reduce variations in the conduction resistance. The regular arrangement can be confirmed by a fact that a prescribed particle disposition is being repeated in the long-side direction of the film, for example.

The lattice axis or arrangement axis of the arrangement of the insulating particle-including conductive particles may be parallel to the long-side direction of the anisotropic conductive film or may intersect with the long-side direction of the anisotropic conductive film and can be determined in accordance with the terminal width, terminal pitch, or the like of the terminal to be connected. For example, in the case of an anisotropic conductive film for a fine pitch, as illustrated in FIG. 1A, a lattice axis A of the insulating particle-including conductive particles 3 intersects obliquely with the long-side direction of the anisotropic conductive film 10A, and an angle $\theta$ formed by the long-side direction (short-side direction of the film) of a terminal 20 to be connected with the anisotropic conductive film 10A and the lattice axis A is from 6° to 84°, and is preferably from 11° to 74°.

The inter-particle distance of the insulating particle-including conductive particles 3 is determined as appropriate in accordance with the size of the terminal to be connected with the anisotropic conductive film, the terminal pitch, and the like. For example, in a case where the anisotropic conductive film is to be applied in a fine-pitch COG (Chip On Glass), the distance between the conductive particles 1 of the insulating particle-including conductive particles 3 nearest to each other is preferably greater than 0.5 times the particle diameter of the insulating particle-including conductive particles, and more preferably greater than 0.7 times the stated particle diameter, from the standpoint of preventing short circuits. On the other hand, from the standpoint of the insulating particle-including conductive particle 3 capturing performance, the distance between the conductive particles 1 of the insulating particle-including conductive particles 3 nearest to each other is preferably less than or equal to four times the particle diameter of the insulating particle-including conductive particles, and more preferably less than or equal to three times the stated particle diameter.

Additionally, the area occupancy ratio of the insulating particle-including conductive particles is determined so as to be less than or equal to 35%, and preferably from 0.3 to 30%. Here, the area occupancy ratio is calculated as: [number density of insulating particle-including conductive particles in plan view]×[average plan view surface area of one insulating particle-including conductive particle]×100.

In this expression, measurement areas for the number density of the insulating particle-including conductive particles are set in the anisotropic conductive film 10A as rectangular areas in which one side is greater than or equal to 100 μm, in a plurality of locations as desired (preferably, five or more locations, and more preferably, ten or more locations). The total surface area of the measurement areas is preferably greater than or equal to 2 mm$^2$. The sizes and number of the individual areas may be adjusted as appropriate in accordance with the state of the number density. As an example of a case of a relatively high number density used in fine-pitch applications, the "number density of insulating particle-including conductive particles in plan view" in the above-described expression can be obtained by first selecting 200 areas having a surface area of 100 μm×100 μm (2 mm$^2$) as desired from the anisotropic conductive film 10A, measuring the number densities thereof using observation images obtained from a metallurgical microscope or the like, and averaging the number densities. The area having a surface area of 100 μm×100 μm is an area in which one or more bumps are present for a connection target with an inter-bump space of less than or equal to 50 μm.

The number density is preferably from 150 to 70000/mm$^2$. Particularly in the case of fine-pitch applications, the number density is preferably from 6000 to 42000/mm$^2$, more preferably from 10000 to 40000/mm$^2$, and still more preferably from 15000 to 35000/mm$^2$. However, less than 150/mm$^2$ is not excluded.

In addition to using a metallurgical microscope as described above, the number density of the insulating particle-including conductive particles may be measured using image analysis software (e.g., WinROOF, by Mitani Corporation) on a microscopy image of the insulating particle-including conductive particles.

The average surface area of each insulating particle-including conductive particle when the film is viewed in plan view can be found through measurement using an observation image of the film surface, obtained by a metallurgical microscope or the like. Image analysis software such as that mentioned above may be used as well. Preferably, N is greater than or equal to 300.

The area occupancy ratio of the insulating particle-including conductive particles when the film is viewed in plan view is an indicator of the thrust required by a pressing jig when bonding the anisotropic conductive film to an electronic component using thermocompression bonding. In the past, to apply an anisotropic conductive film in a fine-pitch application, the number density has been increased by reducing the distance between conductive particles as much as possible without producing short-circuits. However, in a case where the number density is increased in this manner, an extremely high degree of thrust is required by a pressing jig when bonding the anisotropic conductive film to an electronic component using thermocompression bonding. A problem in which past pressing jigs provide insufficient pressure arises as a result. As opposed to this, setting the area occupancy ratio to the above-described range makes it possible to ensure that a lower thrust is required by the pressing jig when bonding the anisotropic conductive film to an electronic component using thermocompression bonding.

Insulating Resin Layer

Minimum Melt Viscosity of Insulating Resin Layer

In the anisotropic conductive film of the present invention, the minimum melt viscosity of the insulating resin layer 5 is not particularly limited, and can be determined appropriately in accordance with application of the anisotropic conductive film, the method for manufacturing the anisotropic conductive film, or the like. For example, as long as concavities 5b (FIG. 3A) and 5c (FIG. 3B) (described later) can be formed, a viscosity of approximately 1000 Pa·s can be set, depending on the method for manufacturing the anisotropic conductive film. On the other hand, when a method for holding the insulating particle-including conductive particles at a prescribed disposition on the surface of the insulating resin layer and pushing the insulating particle-including conductive particles into the insulating resin layer is used as the method for manufacturing the anisotropic conductive film, the minimum melt viscosity of the insulating resin is preferably greater than or equal to 1100 Pa·s from the perspective of ensuring that the insulating resin layer enables film formation.

Figure 3A:
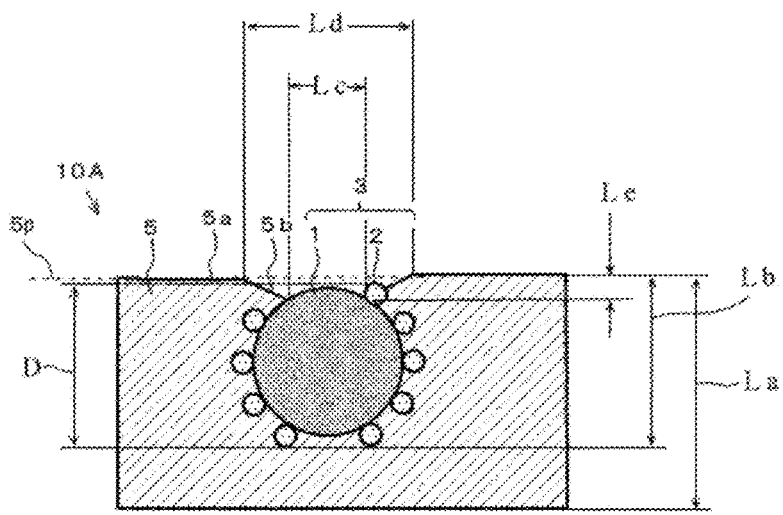
FIG. 3A is a diagram illustrating a concavity in an insulating resin layer in the periphery of an insulating particle-including conductive particle.
Figure 3B:
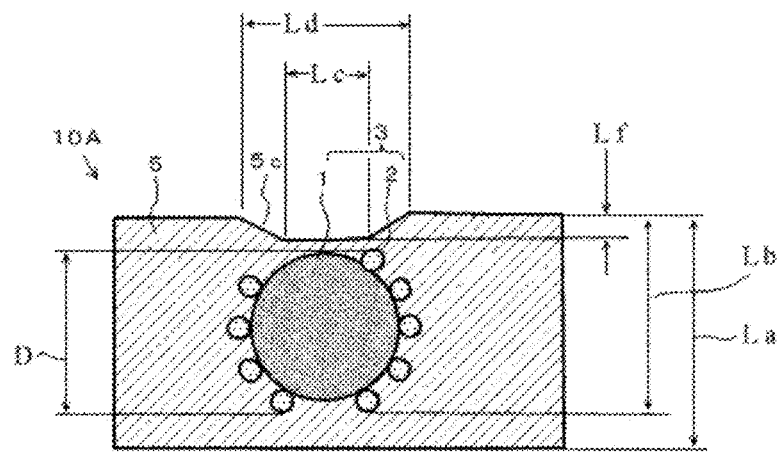
FIG. 3B is a diagram illustrating a concavity in an insulating resin layer above an insulating particle-including conductive particle.

In addition, as mentioned later in the descriptions of the method for manufacturing the anisotropic conductive film, from the perspective of forming concavities 5b around the exposed portions of the insulating particle-including conductive particles 3 pushed into the insulating resin layer 5, as illustrated in FIG. 3A, or from the perspective of forming concavities 5c directly above the insulating particle-including conductive particles 3 pushed into the insulating resin layer 5, as illustrated in FIG. 3B, the minimum melt viscosity is preferably greater than or equal to 1500 Pa·s, more preferably greater than or equal to 2000 Pa·s, even more preferably from 3000 to 15000 Pa·s, and particularly preferably from 3000 to 10000 Pa·s. The minimum melt viscosity can be found in the following manner, for example. A rotary rheometer (available from TA Instruments) is used, a measurement pressure of 5 g is held constant, and a measurement plate of 8 mm in diameter is used. More specifically, the minimum melt viscosity can be found by using a rate of temperature increase of 10° C./minute within a temperature range of from 30 to 200° C., with a measurement frequency of 10 Hz and a load variation of 5 g on the measurement plate.

Setting the minimum melt viscosity of the insulating resin layer 5 to a high viscosity of greater than or equal to 1500 Pa·s makes it possible to suppress needless movement of conductive particles when pressure-bonding the anisotropic conductive film to an article, and particularly makes it possible to prevent the conductive particles, which should be held between terminals during an anisotropic conductive connection, from moving due to resin flow.

In the case where the insulating particle-including conductive particles 3 are pushed into the insulating resin layer 5, one of the following is used as the insulating resin layer 5 at the time when the insulating particle-including conductive particles 3 are pushed into the layer: a highly-viscous material that ensures that the insulating resin layer 5 deforms plastically and the concavities 5b (FIG. 3A) are formed in the insulating resin layer 5 surrounding the insulating particle-including conductive particles 3 when the insulating particle-including conductive particles 3 are pushed into the insulating resin layer 5 so that the insulating particle-including conductive particles 3 are exposed from the insulating resin layer 5; or a highly-viscous material that ensures that the concavities 5c (FIG. 3B) are formed in the surface of the insulating resin layer 5 directly above the insulating particle-including conductive particles 3 when the insulating particle-including conductive particles 3 are pushed into the insulating resin layer 5 so that the insulating particle-including conductive particles 3 are embedded within the insulating resin layer 5 without being exposed from the insulating resin layer 5. To that end, the lower limit of the viscosity of the insulating resin layer 5 at 60° C. is preferably greater than or equal to 3000 Pa·s, more preferably greater than or equal to 4000 Pa·s, and even more preferably greater than or equal to 4500 Pa·s, and the upper limit is preferably less than or equal to 20000 Pa·s, more preferably less than or equal to 15000 Pa·s, and even more preferably less than or equal to 10000 Pa·s. This measurement is made with the same measurement method as in the case of the minimum melt viscosity, and the viscosity can be determined by extracting the value at a temperature of 60° C.

The specific viscosity of the insulating resin layer 5 at the time of the pushing of the insulating particle-including conductive particles 3 into the insulating resin layer 5 is determined in accordance with the shapes, depths, and the like of the concavities 5b and 5c to be formed. The lower limit of the viscosity is preferably greater than or equal to 3000 Pa·s, more preferably greater than or equal to 4000 Pa·s, and even more preferably greater than or equal to 4500 Pa·s, and the upper limit is preferably less than or equal to 20000 Pa·s, more preferably less than or equal to 15000 Pa·s, and even more preferably less than or equal to 10000 Pa·s. In addition, such a viscosity is achieved at a temperature of preferably from 40 to 80° C. and more preferably from 50 to 60° C.

Forming the concavities 5b (FIG. 3A) surrounding the insulating particle-including conductive particles 3 exposed from the insulating resin layer 5 as described above ensures that the resistance from the insulating resin with respect to the flattening of the insulating particle-including conductive particles 3, which arises when the anisotropic conductive film is pressure-bonded to an article, is lower than a case where the concavities 5b are not provided. Accordingly, the conductive particles are easy to be held at the terminals when making an anisotropic conductive connection, which improves the conduction performance and improves the capturing performance.

Meanwhile, forming the concavities 5c (FIG. 3B) in the surface of the insulating resin layer 5 directly above the insulating particle-including conductive particles 3 embedded within the insulating resin layer 5 without being exposed from the insulating resin layer 5 makes it easier for the pressure arising when pressure-bonding the anisotropic conductive film to an article to concentrate at the insulating particle-including conductive particles 3, as compared to a case where the concavities 5c are not formed. Accordingly, the conductive particles are easy to be held at the terminals when making an anisotropic conductive connection, which improves the capturing performance and improves the conduction performance.

In the method for manufacturing the anisotropic conductive film (described later), in a case where the embedding percentage is less than or equal to 100% when the insulating particle-including conductive particles 3 are pushed into the insulating resin layer 5 and the insulating particle-including conductive particles 3 are exposed from the insulating resin layer 5, and in a case where the viscosity of the insulating resin layer 5 is in the above-described range at 60° C., the concavities 5b (FIG. 3A) may be formed in the insulating resin layer 5, surrounding the insulating particle-including conductive particles 3, after the insulating particle-including conductive particles 3 have been pushed into the insulating resin layer 5. At this time, there are cases where only the insulating particles are exposed. However, in the case where the embedding percentage is greater than 100% and the insulating particle-including conductive particles 3 are embedded within the insulating resin layer 5 without being exposed from the insulating resin layer 5, the concavities 5c (FIG. 3B) may be formed in the surface of the insulating resin layer 5 directly above the insulating particle-including conductive particles 3. The meaning of "embedding percentage" will be given in detail later when describing the embedded state of the insulating particle-including conductive particles in a later stage.

The concavities 5b and 5c are formed in accordance with the viscosity, pushing rate, temperature, and the like of the insulating resin layer 5 when the insulating particle-including conductive particles 3 are pushed into the insulating resin layer 5. Whether the concavities 5b and 5c are present does not have any particular influence on the effects of the present invention. However, in a case where deep concavities 5b and 5c (e.g., the depth of the deepest part of the concavities is 10% or greater of the particle diameter D of the insulating particle-including conductive particles) are locally concentrated in a given area and that area is affixed to a substrate, depending on the material, surface state, and the like of the substrate, separation or the like may arise at that area after the anisotropic conductive connection is made. While this may not be a problem in terms of actual use, it may cause a worsening in the outer appearance. As such, it is preferable that the concavities 5b and 5c be made shallower or flat by thermally compressing or spraying the resin in the surface of the anisotropic conductive film in such an area to a degree that does not impede the anisotropic conductive connection. In this case, the resin to be sprayed is preferably of a lower viscosity than the resin that forms the insulating resin layer 5. The resin to be sprayed may be diluted to achieve a concentration that makes it possible to confirm the concavities in the insulating resin layer 5 after spraying.

"Inclinations" or "Undulations" in Place of Concavities

The "concavities" 5b and 5c in the anisotropic conductive film, illustrated in FIGS. 3A and 3B, can also be described from the perspective of "inclinations" or "undulations". This will be described hereinafter with reference to the drawings.

The anisotropic conductive film 10A includes a conductive particle distribution layer, i.e., a layer, on one surface of the insulating resin layer 5, where the insulating particle-including conductive particles 3 are distributed regularly in an exposed state (FIGS. 3A and 3B). A single conductive particle layer is formed, in which the insulating particle-including conductive particles 3 are distributed regularly so that the insulating particle-including conductive particles 3 are not in contact with each other when the film is viewed in plan view, the insulating particle-including conductive particles 3 do not overlap with each other with respect to the film thickness direction, and the positions of the insulating particle-including conductive particles 3 are uniform with respect to the film thickness direction.

Inclinations 5b are formed in a surface 5a of the insulating resin layer 5, which is the surface in the vicinity of the individual insulating particle-including conductive particles 3. Each of the inclinations 5b is formed with respect to a tangent plane 5p of the insulation resin layer 5 to a central portion between adjacent insulating particle-including conductive particles. As will be described later, in the anisotropic conductive film of the present invention, undulations 5c (FIG. 3B) may be formed in the surface of the insulating resin layer 5 directly above the insulating particle-including conductive particles 3 embedded in the insulating resin layer 5.

In the present invention, "inclination" refers to a state in which the surface of the insulating resin layer is not flat in the vicinity of the insulating particle-including conductive particles 3, with part of the insulating resin layer being absent, for a reduced amount of resin, with respect to the tangent plane 5p. In other words, at the inclinations, the surface of the insulating resin layer is missing with respect to the tangent plane near the insulating particle-including conductive particles. On the other hand, "undulation" refers to a state in which the surface of the insulating resin layer is wavy directly above the insulating particle-including conductive particle, and having parts where there is a height difference, such as this waviness, results in a reduced amount of resin. In other words, the amount of resin in the insulating resin layer directly above the insulating particle-including conductive particles is lower than when the surface of the insulating resin layer directly above the insulating particle-including conductive particles follows the tangent plane. There are thus cases where only the insulating particles are exposed at the wavy parts. These can be seen by comparing locations corresponding to parts directly above the insulating particle-including conductive particles with flat surface parts between the conductive particles (FIGS. 3A and 3B). Note that the starting points of the undulations may be inclinations as well.

As described above, the inclinations 5b (FIG. 3A) being formed surrounding the insulating particle-including conductive particles 3 exposed from the insulating resin layer 5 ensures that the resistance from the insulating resin with respect to the flattening of the insulating particle-including conductive particles 3, which arises when an anisotropic conductive connection is made and the insulating particle-including conductive particles 3 are held between terminals, is lower than a case where the inclinations 5b are not provided. Accordingly, the insulating particle-including conductive particles are more easily held at the terminals, which improves the conduction performance and improves the capturing performance. These inclinations preferably follow the outer shapes of the insulating particle-including conductive particles. In addition to making it easier to achieve the effects with respect to connections, doing so makes it easier to recognize the insulating particle-including conductive particles, which in turn makes inspections and the like easier to carry out when manufacturing the anisotropic conductive film. Although the inclinations and undulations may be partially lost when using a heat press on the insulating resin layer, the present invention includes this as well. In this case, the insulating particle-including conductive particles may be exposed at single points on the surface of the insulating resin layer. An anisotropic conductive film is connected to a wide range of electronic components, and is tuned to accommodate such connections. It is thus desirable that the film have a high level of design freedom so as to satisfy a variety of conditions, and the film can therefore be used even if the inclinations or undulations are reduced or partially extinguished.

Additionally, by forming the undulations 5c (FIG. 3B) in the surface of the insulating resin layer 5 directly above the insulating particle-including conductive particles 3, which are embedded so as not to be exposed from the insulating resin layer 5, it is easier for pushing force from terminals to be exerted on the insulating particle-including conductive particle when making an anisotropic connection, in the same manner as with the inclinations. When the undulations are present, the amount of resin directly above the insulating particle-including conductive particles is lower than in a case where the resin is deposited in a flat manner. It is therefore easier to remove the resin directly above the insulating particle-including conductive particles when making a connection, which makes it easier for the terminals and the insulating particle-including conductive particles to contact each other. This improves the insulating particle-including conductive particles capturing performance at the terminals, and improves the conduction reliability.

Positions of Insulating Particle-Including Conductive Particles with Respect to Thickness Direction of Insulating Resin Layer When considering the positions of the insulating particle-including conductive particles 3 with respect to the thickness direction of the insulating resin layer 5 from the perspective of the "inclinations" or "undulations", the insulating particle-including conductive particles 3 may be exposed from the insulating resin layer 5 without being exposed from the resin layer 5, and may be embedded within the insulating resin layer 5, as described earlier. However, a ratio between a distance Lb of the deepest part of the insulating particle-including conductive particles from the tangent plane 5p to a central portion between adjacent insulating particle-including conductive particles (called an "embedded amount" hereinafter), and the particle diameter D of the insulating particle-including conductive particles (Lb/D) (called an "embedding percentage" hereinafter), is preferably greater than or equal to 30% and less than or equal to 105%. To achieve the effects of this invention, this ratio is more preferably greater than or equal to 60% and less than or equal to 105%.

When the embedding percentage (Lb/D) is greater than or equal to 30% and less than 60%, a higher percentage of the insulating particle-including conductive particles is exposed from the relatively high-viscosity insulating resin layer that holds the insulating particle-including conductive particles, and thus mounting can be carried out at lower temperatures and lower pressures. Setting the percentage to greater than or equal to 60% makes it easier for the insulating particle-including conductive particles 3 to be held in a prescribed particle distribution state or a prescribed arrangement by the insulating resin layer 5. Additionally, there is an increased area of contact between the insulating particle-including conductive particles and the resin during manufacture (when pushing into the film), which is expected to make it easier to achieve the effects of this invention. Setting the percentage to less than or equal to 105% makes it possible to reduce the amount of resin in the insulating resin layer that causes the conductive particles between terminals to needlessly flow when making an anisotropic conductive connection.

Note that a numerical value of greater than or equal to 80%, preferably greater than or equal to 90%, and more preferably greater than or equal to 96%, of the total number of insulating particle-including conductive particles contained in the anisotropic conductive film, is referred to as the numerical value of the embedding percentage (Lb/D). As such, an embedding percentage of greater than or equal to 30% and less than or equal to 105% means that an embedding percentage of greater than or equal to 80%, preferably greater than or equal to 90%, and more preferably greater than or equal to 96%, of the total number of insulating particle-including conductive particles contained in the anisotropic conductive film, is greater than or equal to 30% and less than or equal to 105%. When the embedding percentage (Lb/D) of all of the insulating particle-including conductive particles is uniform in this manner, pressure is applied to the insulating particle-including conductive particles in a uniform manner. This provides a good state of capture for the insulating particle-including conductive particles at terminals, and improves the stability of conduction.

The embedding percentage (Lb/D) can be found by taking 10 or more areas having a surface area of greater than or equal to 30 mm² as desired from the anisotropic conductive film, observing parts of the film cross section through SEM images, and measuring a total of 50 or more of the insulating particle-including conductive particles. 200 or more insulating particle-including conductive particles may be measured in order to further improve the accuracy.

A certain number of measurements can be taken for the embedding percentage (Lb/D) at one time by adjusting the focus in an image having a planar view. Alternatively, a laser displacement sensor (available from Keyence Corporation or the like) may be used to measure the embedding percentage (Lb/D).

From the perspective of more easily achieving the effects of the inclinations 5b (FIG. 3A) in the insulating resin layer 5 surrounding the insulating particle-including conductive particles or the undulations 5c (FIG. 3B) in the insulating resin layer directly above the insulating particle-including conductive particles, a ratio (Le/D) of a maximum depth Le of the inclinations 5b to the particle diameter D of the insulating particle-including conductive particles 3 is preferably less than 50%, more preferably less than 30%, and even more preferably from 20 to 25%. A ratio (Ld/D) of a maximum diameter Ld of the inclinations 5b or the undulations 5c to the particle diameter D of the insulating particle-including conductive particles 3 is preferably greater than or equal to 100% and more preferably from 100 to 150%. A ratio (Lf/D) of a maximum depth Lf of the undulations 5c to the particle diameter D of the insulating particle-including conductive particles 3 is greater than 0, preferably less than 10%, and more preferably less than or equal to 5%.

Note that a diameter Lc of the exposed portions of (directly above) the insulating particle-including conductive particles 3 at the inclinations 5b or the undulations 5c is preferably less than or equal to the particle diameter D of the insulating particle-including conductive particles 3, and is preferably from 10 to 90% of the particle diameter D. The insulating particle-including conductive particles 3 may be exposed at one point at the apical part of the particle, or the insulating particle-including conductive particles 3 may be completely embedded in the insulating resin layer 5 so that the diameter Lc is zero.

In the present invention, the presence of the inclinations 5b and the undulations 5c in the surface of the insulating resin layer 5 can be confirmed by observing a cross section of the anisotropic conductive film through a scanning electron microscope, and can also be confirmed by observing a planar view. The inclinations 5b and the undulations 5c can also be observed through an optical microscope or a metallurgical microscope. The sizes of the inclinations 5b and the undulations 5c can be confirmed by adjusting the focus during image-based observation. The same applies even after the inclinations or the undulations have been reduced by a heat press as described above. This is because traces may remain.

Composition of Insulating Resin Layer

The insulating resin layer 5 is preferably formed from a curable resin composition, and can be formed from a thermo-polymerizable composition containing a thermo-polymerizable compound and a thermal polymerization initiator, for example. The thermo-polymerizable composition may contain a photopolymerization initiator as necessary.

When using both a thermal polymerization initiator and a photopolymerization initiator, thermo-polymerizable compound functioning also as the photopolymerizable compound may be used, or a photopolymerizable compound may be contained in addition to the thermo-polymerizable compound. The composition preferably contains a photopolymerizable compound separately from the thermo-polymerizable compound. For example, a cationic curing initiator may be used as the thermal polymerization initiator, an epoxy resin may be used as the thermo-polymerizable compound, a photoradical polymerization initiator may be used as the photopolymerization initiator, and an acrylate compound may be used as the photopolymerizable compound.

Here, a plurality of types of photopolymerization initiators which react with light of different wavelengths may be contained. As a result, different wavelengths may be used for the photocuring of a resin forming the insulating resin layer at the time of the production of the anisotropic conductive film and the photocuring of a resin for bonding electronic components to one another at the time of anisotropic conductive connection.

Some or all of the photopolymerizable compound contained in the insulating resin layer may be photocured by means of photocuring carried out when the anisotropic conductive film is manufactured. As a result of this photocuring, the disposition of the insulating particle-including conductive particles 3 in the insulating resin layer 5 is maintained or stabilized, which yields prospects for the suppression of short circuits and the improvement of conductive particle capturing. In addition, the viscosity of the insulating resin layer in the process of manufacturing the anisotropic conductive film may be adjusted as appropriate through this photocuring.

The compounded amount of the photopolymerizable compound in the insulating resin layer is preferably less than or equal to 30 mass %, more preferably less than or equal to 10 mass %, and even more preferably less than 2 mass %. This is because when the amount of the photopolymerizable compound is too large, an increased amount of thrust is required for pushing when making a connection.

Examples of the thermo-polymerizable composition include thermal radical polymerizable acrylate-based compositions containing a (meth)acrylate compound and a thermal radical polymerization initiator and thermal cationic polymerizable epoxy compositions containing an epoxy compound and a thermal cationic polymerization initiator. A thermal anionic polymerizable epoxy composition containing a thermal anionic polymerization initiator may be used instead of a thermal cationic polymerizable epoxy composition containing a thermal cationic polymerization initiator. Multiple types of polymerizable compositions may be used together as long as doing so poses no particular problems. The combined use of a cationic polymerizable compound and a radical polymerizable compound can be given as an example of combined use.

Herein, the (meth)acrylate compound may be an existing known thermo-polymerizable (meth)acrylate monomer. Examples thereof include monofunctional (meth)acrylate-based monomers and polyfunctional, that is, two or more functional, (meth)acrylate-based monomers.

Examples of the thermal radical polymerization initiator may include organic peroxides, and azo compounds. In particular, organic peroxides may be preferred because they do not produce nitrogen, which can induce bubbles.

The amount of the thermal radical polymerization initiator to be used preferably ranges from 2 to 60 parts by mass, and more preferably from 5 to 40 parts by mass, per 100 parts by mass of a (meth)acrylate compound. When the amount is too small, insufficient curing will occur. When the amount is too large, the product life will decrease.

Examples of the epoxy compound may include bisphenol A type epoxy resins, bisphenol F type epoxy resins, novolak type epoxy resins, modifications of these epoxy resins, and cycloaliphatic epoxy resins. Two or more of these may be used in combination. An oxetane compound may be used in addition to the epoxy compound.

The thermal cationic polymerization initiator may be a known thermal cationic polymerization initiator for epoxy compounds. Examples of the initiator include iodonium salts, sulfonium salts, phosphonium salts, and ferrocenes, which generate acid via heat. In particular, aromatic sulfonium salts, which exhibit good temperature latency, may be preferred.

The amount of the thermal cationic polymerization initiator to be used preferably ranges from 2 to 60 parts by mass, and more preferably from 5 to 40 parts by mass, per 100 parts by mass of an epoxy compound. When the amount is too small, insufficient curing tends to occur. When the amount is too large, the product life tends to decrease.

The thermo-polymerizable composition preferably contain a film forming resin and a silane coupling agent. Examples of the film forming resin may include, phenoxy resins, epoxy resins, unsaturated polyester resins, saturated polyester resins, urethane resins, butadiene resins, polyimide resins, polyamide resins, and polyolefin resins. Two or more of these may be used in combination. Among these, phenoxy resins may be preferred from the standpoint of film forming ability, processability, and connection reliability. Preferably, the average molecular weight is greater than or equal to 10000. Examples of the silane coupling agent may include epoxy silane coupling agents and acrylic silane coupling agents. These silane coupling agents are mostly alkoxy silane derivatives.

In addition to the above-described insulating particle-including conductive particles 3, the thermo-polymerizable composition may also contain an insulating filler to adjust the melt viscosity. Examples of this include silica powders and alumina powders. A fine filler in which the particle diameter of the insulating filler is from 20 to 1000 nm is preferably used, and the compounded amount is preferably from 5 to 50 parts by mass per 100 parts by mass of the thermo-polymerizable compound (photopolymerizable compound) such as an epoxy compound.

The anisotropic conductive film of the present invention may also contain fillers, softeners, promoters, antioxidants, colorants (pigments and dyes), organic solvents, ion scavengers, and the like in addition to the insulating filler described above.

Thickness of Insulating Resin Layer

In the anisotropic conductive film of the present invention, a lower limit of greater than or equal to 0.3, and an upper limit of less than or equal to 10, can be set for the ratio between a layer thickness La of the insulating resin layer 5 and the particle diameter D of the insulating particle-including conductive particles 3 (La/D), for the reasons described later. Accordingly, the ratio is preferably from 0.3 to 10, more preferably from 0.6 to 8, and still more preferably from 0.6 to 6. Here, the particle diameter D of the insulating particle-including conductive particles 3 refers to the average particle diameter. When the layer thickness La of the insulating resin layer 5 is too high, the insulating particle-including conductive particles 3 tend to be displaced due to resin flow when making an anisotropic conductive connection, and the capacity to capture the insulating particle-including conductive particles 3 at the terminals is diminished. This tendency is particularly marked when the ratio (La/D) is greater than 10, and thus less than or equal to 8 is preferable, and less than or equal to 6 is more preferable. On the other hand, in a case where the layer thickness La of the insulating resin layer 5 is too low and the ratio (La/D) drops below 0.3, it is difficult for the insulating resin layer 5 to keep the insulating particle-including conductive particles 3 in a prescribed particle distribution state or a prescribed arrangement. As such, the ratio (La/D) is preferably greater than or equal to 0.3, and from the perspective of the insulating resin layer 5 reliably maintaining a prescribed particle distribution state or a prescribed arrangement, is more preferably greater than or equal to 0.6. Additionally, when the terminal to be connected is a high-density COG, the ratio (La/D) of the layer thickness La of the insulating resin layer 5 to the particle diameter D of the insulating particle-including conductive particles 3 is preferably from 0.8 to 2.

Embedded State of Insulating Particle-Including Conductive Particles in Insulating Resin Layer The embedded state of the insulating particle-including conductive particles 3 in the insulating resin layer 5 preferably has an embedding percentage of greater than or equal to 30% and less than or equal to 105%. Setting the embedding percentage to greater than or equal to 30%, and preferably greater than or equal to 60%, makes it easier for the insulating particle-including conductive particles 3 to be held in a prescribed particle distribution state or a prescribed arrangement by the insulating resin layer 5. Additionally, setting the embedding percentage to less than or equal to 105% makes it possible to reduce the amount of resin in the insulating resin layer that causes the insulating particle-including conductive particles to needlessly flow when making an anisotropic conductive connection.

Here, when a distance between the surface 5a of the insulating resin layer 5 in which the insulating particle-including conductive particles 3 (the surface of the insulating resin layer 5 where more of the insulating particle-including conductive particles 3 are distributed) and the deepest part of the insulating particle-including conductive particles 3 embedded in the insulating resin layer 5 with respect to the surface 5a is taken as an embedded amount Lb, the embedding percentage is a ratio (Lb/D) of the embedded amount Lb to the particle diameter D of the insulating particle-including conductive particles 3 (FIG. 1B).

Note that in the present invention, a numerical value of greater than or equal to 80%, preferably greater than or equal to 90%, and more preferably greater than or equal to 96%, of the total number of insulating particle-including conductive particles contained in the anisotropic conductive film, is referred to as the numerical value of the embedding percentage (Lb/D). As such, an embedding percentage of greater than or equal to 30% and less than or equal to 105% means that an embedding percentage of greater than or equal to 80%, preferably greater than or equal to 90%, and more preferably greater than or equal to 96%, of the total number of insulating particle-including conductive particles contained in the anisotropic conductive film, is greater than or equal to 30% and less than or equal to 105%. When the embedding percentage (Lb/D) of all of the insulating particle-including conductive particles is uniform in this manner, pressure is applied to the conductive particles in a uniform manner. This provides a good state of capture for the conductive particles at terminals, and improves the stability of conduction.

The embedding percentage (Lb/D) can be found by taking 10 or more areas having a surface area of greater than or equal to 30 mm$^2$ as desired from the anisotropic conductive film, observing parts of the film cross section through SEM images, and measuring a total of 50 or more of the conductive particles. 200 or more conductive particles may be measured in order to further improve the accuracy.

A certain number of measurements can also be taken for the embedding percentage (Lb/D) at one time by adjusting the focus in an image having a planar view. Alternatively, a laser displacement sensor (available from Keyence Corporation or the like) may be used to measure the embedding percentage (Lb/D).

Method for Producing Anisotropic Conductive Film

Figure 4A:
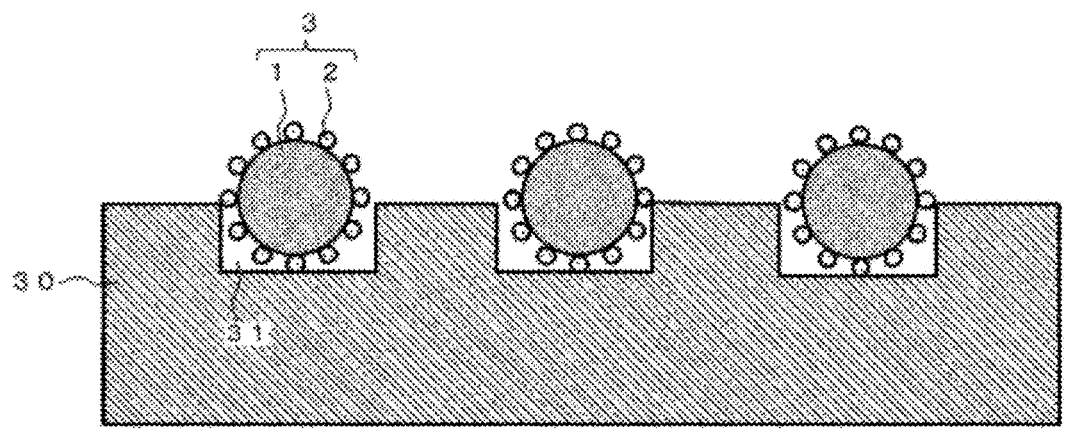
FIG. 4A is a cross-sectional view illustrating a method for manufacturing the anisotropic conductive film 10A of the examples.

In one example of a method for manufacturing the anisotropic conductive film 10A illustrated in FIGS. 1A and 1B, concave portions 31 of a transfer mold 30 are filled with the insulating particle-including conductive particles 3 (FIG. 4A). The concave portions 31 are formed having the same arrangement as the insulating particle-including conductive particles 3 in the anisotropic conductive film.

The transfer mold 30 may be a mold made of an inorganic material or an organic material and having the concave portions 31 formed through a known opening forming process such as photolithography. Examples of the inorganic material include silicon, various ceramics, glass, and metal such as stainless steel. Examples of the organic material include various resins. The transfer mold may have a plate shape, a roll shape, or another shape.

Figure 4B:
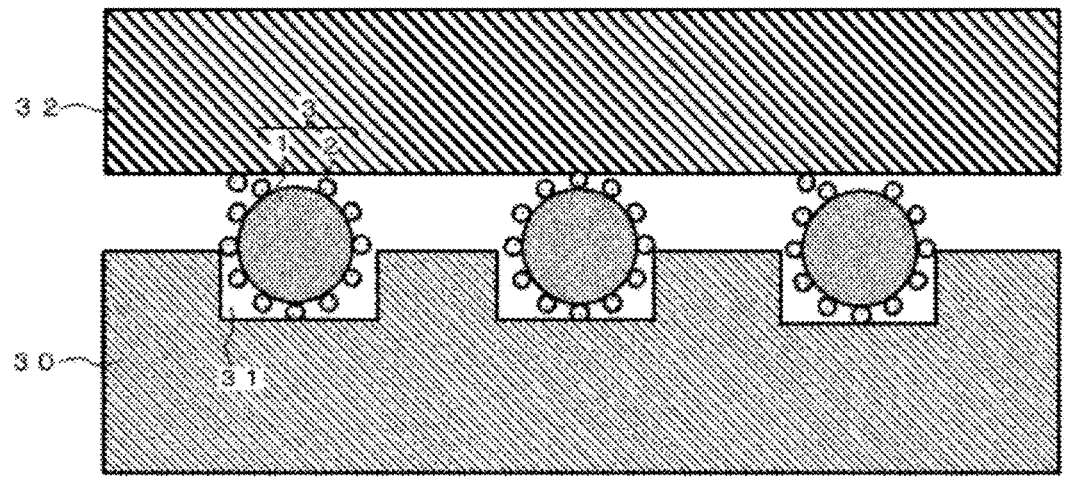
FIG. 4B is a cross-sectional view illustrating a method for manufacturing the anisotropic conductive film 10A of the examples.
Figure 4C:
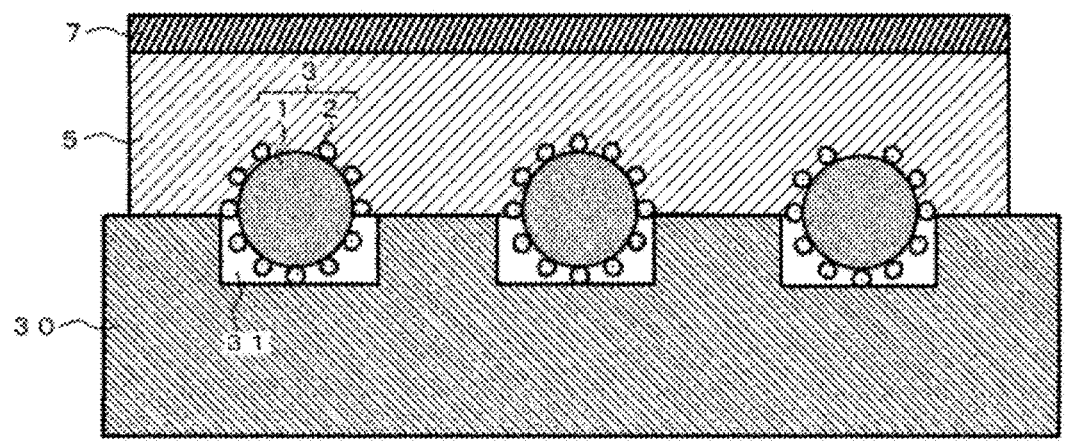
FIG. 4C is a cross-sectional view illustrating a method for manufacturing the anisotropic conductive film 10A of the examples.
Figure 4D:
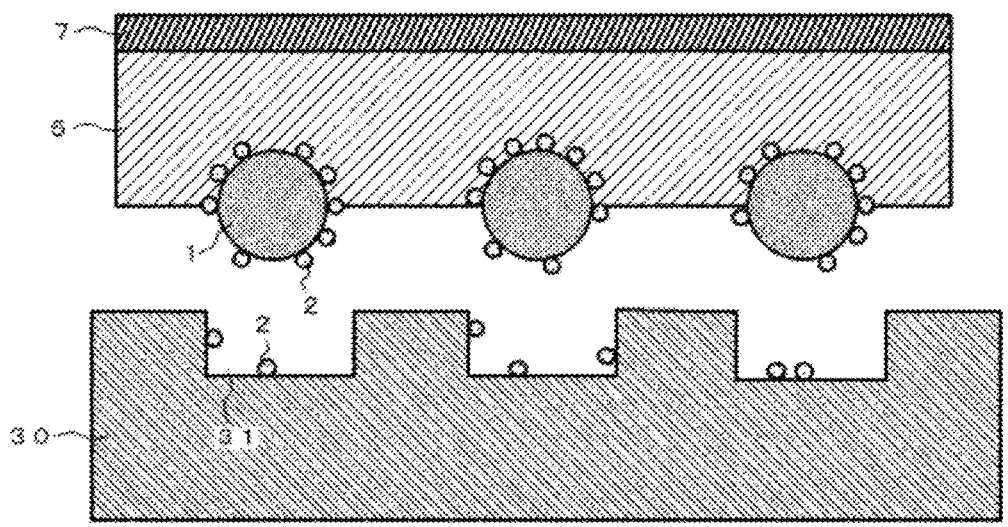
FIG. 4D is a cross-sectional view illustrating a method for manufacturing the anisotropic conductive film 10A of the examples.

On the other hand, the insulating resin layer 5 is formed as a film on a release film 7, and the insulating particle-including conductive particles 3 with which the transfer mold 30 has been filled are then covered with the insulating resin layer 5 (FIG. 4C). Alternatively, a flat plate 32 may be brought into contact with the insulating particle-including conductive particles 3 with which the transfer mold 30 has been filled before the insulating particle-including conductive particles 3 are covered with the insulating resin layer 5 so as to separate the insulating particles 2 from the conductive particles 1 (FIG. 4B), and the insulating particle-including conductive particles 3 may then be covered with the insulating resin layer 5 (FIG. 4C). Next, the insulating resin layer 5 is separated from the transfer mold 30, and the insulating resin layer 5, to which the insulating particle-including conductive particles 3 have been transferred, is obtained (FIG. 4D). In the process of transferring the insulating particle-including conductive particles 3, the transfer mold 30 and the insulating particles 2 rub against each other, and thus the insulating particles 2 that were in contact with the bottom surfaces of the concave portions 31 in the transfer mold 30 (the insulating particles 2 in area A1) separate from the insulating particle-including conductive particles 3 with ease. Additionally, when the insulating particle-including conductive particles 3 within the transfer mold 30 are covered by the insulating resin layer 5, a large force acts on the insulating particles 2 that make contact with the insulating resin layer 5 first, and the insulating particles 2 in this area (the insulating particles 2 in area A2) may also separate. Accordingly, there are cases where insulating particles 2 are present (interspersed) upon the film.

On the other hand, with respect to the film planar direction, the insulating particles 2 do not separate from the insulating resin layer 5 even after the insulating resin layer 5 is removed from the transfer mold 30, and are instead kept in the insulating resin layer 5.

Accordingly, the number of the insulating particles 2, in the insulating particle-including conductive particles 3, that are in contact with the conductive particles 1 with respect to the film thickness direction is lower than the number of insulating particles 2 in contact with the conductive particles 1 with respect to the film planar direction after the insulating particle-including conductive particles 3 have been transferred to the insulating resin layer 5 than before the transfer.

Figure 4E:
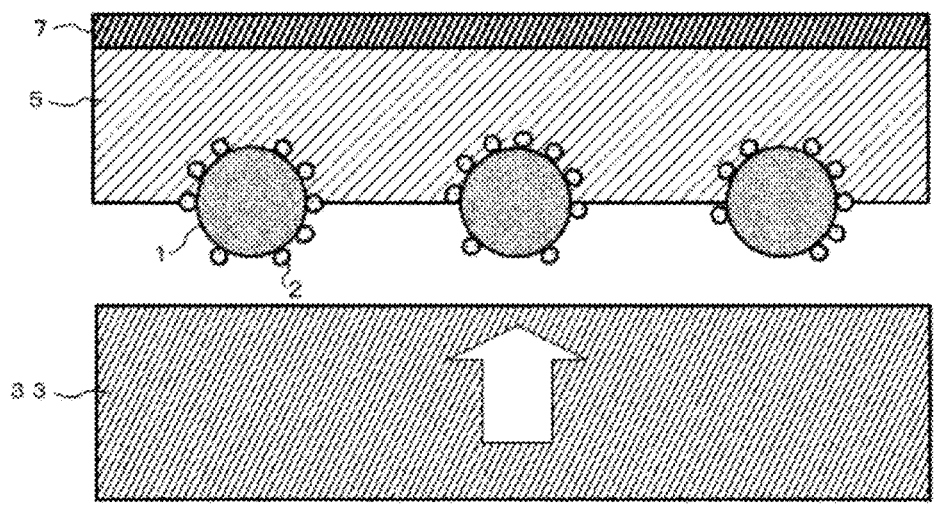
FIG. 4E is a cross-sectional view illustrating a method for manufacturing the anisotropic conductive film 10A of the examples.

Next, the insulating particle-including conductive particles 3 transferred to the insulating resin layer 5 are pushed with a flat plate or a roller 33 as necessary (FIG. 4E). During this pushing, the insulating particles 2 that form the insulating particle-including conductive particles 3 and that are on the side where the flat plate or the roller 33 is located (the insulating particles 2 in area A1) separate relatively from the conductive particles 1 due to the contact with the flat plate or the roller 33.

A pushing amount Lb when using a flat plate or the roller 33 to push the insulating particle-including conductive particles 3 transferred to the insulating resin layer 5 is preferably adjusted so that the embedding percentage (Lb/D) is greater than or equal to 30% and less than or equal to 105%, and more preferably greater than or equal to 60% and less than or equal to 105%. Additionally, the pushing amount Lb is preferably determined in accordance with the thrust and the like required of the pressing jig for the pushing.

Figure 4F:
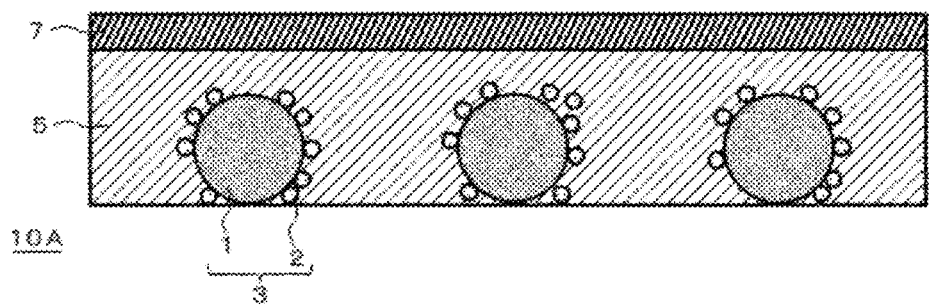
FIG. 4F is a cross-sectional view illustrating a method for manufacturing the anisotropic conductive film 10A of the examples.

In this manner, an anisotropic conductive film 10A having a reduced number of insulating particles 2, of the insulating particles 2 in the insulating particle-including conductive particles 3, that are in contact with the conductive particles 1 with respect to the film thickness direction of the anisotropic conductive film, can be obtained (FIG. 4F).

In the above-described method for manufacturing the anisotropic conductive film 10A, the number of insulating particles 2 that separate from the insulating particle-including conductive particles 3 can be adjusted using the temperature and viscosity of the insulating resin layer 5, the embedding percentage (Lb/D), and the like.

Variation on Anisotropic Conductive Film

Figure 5:
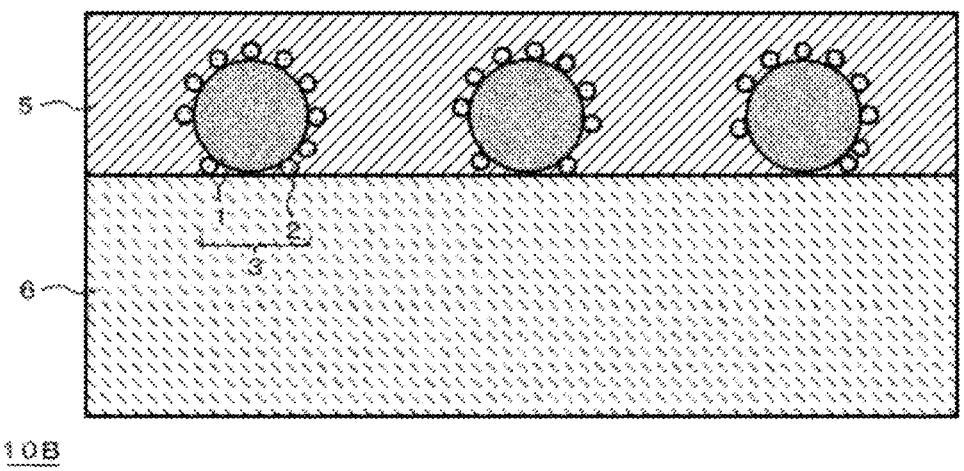
FIG. 5 is a cross-sectional view of an anisotropic conductive film 10B of examples.

In the anisotropic conductive film of the present invention, a low-viscosity insulating resin layer 6 having a lower minimum melt viscosity than the insulating resin layer 5 may be laminated upon the insulating resin layer 5 in which the insulating particle-including conductive particles 3 are embedded, as in the anisotropic conductive film 10B illustrated in FIG. 5. As a result of the lamination of the low-viscosity insulating resin layer 6, spaces formed by the electrodes or bumps of an electronic component can be filled when the electronic component is anisotropic conductively connected using the anisotropic conductive film, which makes it possible to improve the adhesiveness.

From a practical standpoint, the minimum melt viscosity ratio of the insulating resin layer 5 and the low-viscosity insulating resin layer 6 is preferably greater than or equal to 2, more preferably greater than or equal to 5, and even more preferably greater than or equal to 8 and less than or equal to 15. More specifically, the preferable minimum melt viscosity of the low-viscosity insulating resin layer 6 is less than or equal to 3000 Pa·s, more preferably less than or equal to 2000 Pa·s, and particularly preferably from 1000 to 2000

Pa·s. By using a low-viscosity for the low-viscosity insulating resin layer 6 in this manner, the spaces formed by the electrodes or bumps of the electronic component can be filled with the low-viscosity insulating resin layer. As a result, the insulating resin layer 5 moves by a relatively lower amount, which makes it difficult for the insulating particle-including conductive particles 3 between terminals to flow due to the flow of resin. This makes it possible to improve the adhesiveness between electronic components without sacrificing the insulating particle-including conductive particles 3 capturing performance when making an anisotropic conductive connection.

The overall minimum melt viscosity of the anisotropic conductive film 10B when the insulating resin layer 5 and the low-viscosity insulating resin layer 6 are combined is preferably from 200 to 4000 Pa·s.

Note that the low-viscosity insulating resin layer 6 can be formed by adjusting the viscosity of a resin composition similar to that used for the insulating resin layer 5.

In the anisotropic conductive film 10B, the layer thickness of the low-viscosity insulating resin layer 6 is preferably from 4 to 20 μm. Alternatively, the thickness is preferably from 1 to 8 times the particle diameter D of the insulating particle-including conductive particles.

Figure 6:
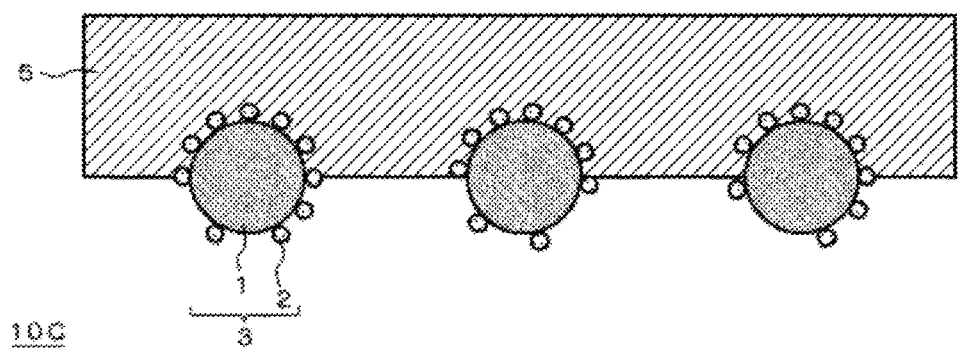
FIG. 6 is a cross-sectional view of an anisotropic conductive film 10C of examples.
Figure 7:
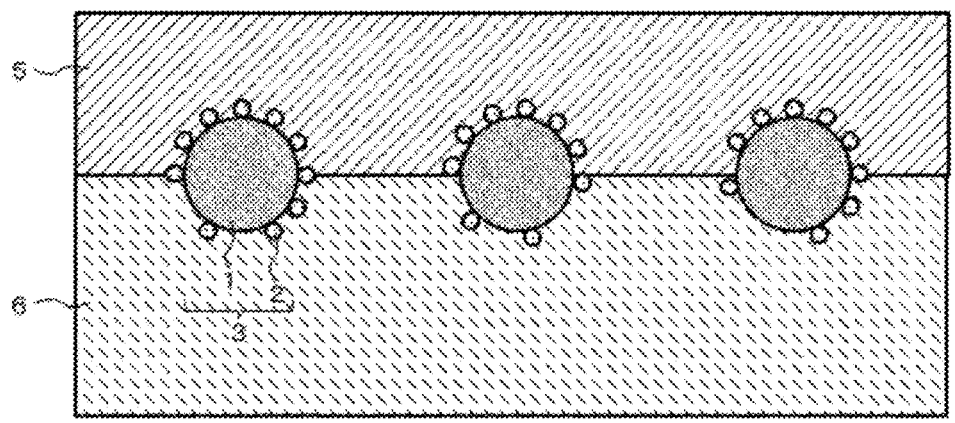
FIG. 7 is a cross-sectional view of an anisotropic conductive film 10D of examples.

In the present invention, a film obtained after separating the insulating resin layer 5 from the transfer mold 30 but before pushing the insulating particle-including conductive particles 3 in may be used as an anisotropic conductive film 10C (FIG. 6), and a film obtained by laminating the low-viscosity insulating resin layer 6 onto the stated film may be used as an anisotropic conductive film 10D (FIG. 7). In this case, the insulating particle-including conductive particles may be present between the insulating resin layer and the low-viscosity insulating resin layer. Additionally, the number of insulating particles on the conductive particles when the low-viscosity insulating resin layer-side film surface is viewed in plan view is preferably lower than the number of insulating particles on the conductive particles when the insulating resin layer-side film surface is viewed in plan view. Furthermore, a low-viscosity insulating resin layer may be laminated, as necessary, on the side of the insulating resin layer 5 opposite from the side on which the low-viscosity insulating resin layer 6 is located.

A plurality of layers of the insulating particle-including conductive particles 3 may be provided in different locations with respect to the film thickness direction. These variations may be combined as appropriate.

Electronic Component Connected Using Anisotropic Conductive Film

Anisotropic conductive films of the present invention can be advantageously used when anisotropic conductively connecting a first electronic component, such as an IC chip, an IC module, or an FPC and the like, to a second electronic component, such as an FPC, a glass substrate, a plastic substrate, a rigid substrate, or a ceramic substrate and the like. IC chips or wafers may be stacked into multiple layers. Note that the electronic components that can be connected using the anisotropic conductive film of the present invention are not limited to the above-described electronic components. Many types of electronic components, which have become diverse in recent years, can be used.

Connection Method and Connection Structure Using Anisotropic Conductive Film

The present invention provides a method for manufacturing a connection structure that anisotropic conductively connects electronic components to each other using the anisotropic conductive film of the present invention. The present invention also provides the connection structure obtained using this method for manufacturing, i.e., a connection structure in which the terminals of opposing electronic components are anisotropic conductively connected by insulating particle-including conductive particles and an insulating resin layer, the connection structure containing insulating particle-including conductive particles having insulating particle-lacking areas, which face in the direction in which the terminals oppose each other, in the insulating particle-including conductive particles not held between the opposing terminals.

This connection structure includes insulating particle-including conductive particles held between opposing terminals, as well as insulating particle-including conductive particles having an insulating particle-lacking area facing in the direction in which the terminals oppose each other. In this connection structure, the direction in which the terminals oppose each other corresponds to the film thickness direction of the anisotropic conductive film of the present invention, the anisotropic conductive film being used to manufacture the connection structure. A connection planar direction of the terminals corresponds to the film planar direction of the anisotropic conductive film. "Insulating particle-lacking area" refers to an area in which part of the surface of an insulating particle-including conductive particle has a lower insulating particle surface density than in an annular part on the outer side thereof. Thus, in this connection structure, the insulating particle-including conductive particles held between opposing terminals correspond to the above-described area A1 or A2, in which the anisotropic conductive film has a reduced number of insulating particles. These insulating particle-including conductive particles can be called insulating particle-including conductive particles in which the number of insulating particles in contact with conductive particles with respect to the direction in which the terminals oppose each other is lower than the number of insulating particles in contact with conductive particles in the terminal connection planar direction (a direction orthogonal to the direction in which the terminals oppose each other). These insulating particle-including conductive particles are assumed to be particles in which the orientations of the insulating particle-lacking areas for the insulating particle-including conductive particles not held between the above-described opposing terminals are held by the insulating resin until immediately before being held by the terminals, and those orientations are held even after the particles are held by the terminals. With the insulating particle-including conductive particles held between the opposing terminals, it is preferable, from the standpoint of the stability of conduction, that the insulating particle-lacking area make contact with at least one of the opposing terminals, and more preferable that the insulating particle-lacking area make contact with both of the opposing terminals.

Additionally, as described above, the insulating particle-including conductive particles in which the insulating particle-lacking area faces the direction in which the terminals oppose each other in the connection structure correspond to the insulating particle-including conductive particles present in area A1 or A2, in which the number of insulating particles in the anisotropic conductive film is reduced. As such, the above-described relationship of $(N_{A3}\ N_{A4}) > (N_{A1} + N_{A2})$ in the anisotropic conductive film is satisfied.

To conceptually describe the insulating particle-including conductive particles in the insulating particle-lacking area in the connection structure, assume first that the insulating particle-including conductive particles are spheres. When a partial area of the surface of the sphere corresponding to a center angle of 45° has a lower insulating particle surface density than an annular area corresponding to a center angle of from 45° to 135° on the outside of the partial area, the insulating particle-lacking area can be thought of as that partial area on the surface of the sphere corresponding to the center angle of 45°.

In this connection structure, the insulating particle-including conductive particles not held by opposing terminals include insulating particle-including conductive particles between opposing electronic components, which are held in an area, of the connection surface between the opposing electronic components, where terminal rows of the electronic components are not formed. In this case, assuming that the opposing electronic components are the first electronic component and the second electronic component, for example, the insulating particle-including conductive particles are the insulating particle-including conductive particles held in the direction, in which the electronic components oppose each other, by the area in which the terminal row of the first electronic component is not formed and the area in which the terminal row of the second electronic component is not formed.

Additionally, in this connection structure, the insulating particle-including conductive particles not held between opposing terminals include insulating particle-including conductive particles that, when the terminal rows of the electronic components are formed with a prescribed space between terminals, are present between the spaces between terminals of the opposing electronic components.

In other words, "insulating particle-including conductive particles not held between opposing terminals" refers to the many insulating particle-including conductive particles that do not contribute to the connection in the connection structure.

Typically, in the connection structure, the insulating particle-including conductive particles not held between the opposing terminals include particles that, due to heat and pressure when making the anisotropic conductive connection, move or change orientation relative to the state before the heat and pressure was applied. The extent to which the particles change orientation differs depending on the positions of the insulating particle-including conductive particles relative to the terminals, the viscosity of the insulating resin layer, the heating and pressure conditions, and the like. However, the insulating particle-including conductive particles in the connection structure also include particles that have the same orientations as from before the heat and pressure was applied. Accordingly, when the anisotropic conductive film used to manufacture the connection structure is the anisotropic conductive film of the present invention, at least some of the insulating particle-including conductive particles not held between the opposing terminals will have insulating particle-lacking areas oriented in the direction in which the opposing terminals oppose each other, which indicates that the structure is a connection structure according to the present invention. In particular, when, in the connection structure, insulating particle-including conductive particles having conductive particle-lacking areas oriented in the direction in which the opposing terminals oppose each other are concentrated in a certain area, the connection structure can easily be identified as the connection structure according to the present invention.

Although the anisotropic conductive film is sometimes cut to substantially the same size as the outer shape of one of the electronic components and used in that state, the film is typically cut to a larger size than the outer shape of one of the electronic components and used in that state. In other words, there are cases where areas that do not contribute to the connection (that is, that are sufficiently distanced from tools) are present. Accordingly, there are cases where insulating particle-lacking areas which, with respect to the direction in which the terminals oppose each other, face the anisotropic conductive film on the outer side of the area between the opposing electronic components, are present. The characteristics of the connection structure of the present invention can be confirmed from this as well.

Additionally, when the insulating particle-including conductive particles are arranged regularly in the anisotropic conductive film used to manufacture the connection structure, there are cases where it can be seen that even the insulating particle-including conductive particles not held between opposing terminals keep their regular arrangement in the connection structure. In this case, it is easy to confirm that the insulating particle-lacking areas of the insulating particle-including conductive particles for which the regular arrangement can be seen are oriented in the direction in which the terminals oppose each other. It is also easy to confirm that $(N_{A3}+N_{A4})>(N_{A1}+N_{A2})$ in an anisotropic conductive film used in the manufacture.

Note that even with a structure obtained partway through the process of manufacturing the connection structure of the present invention, in which the anisotropic conductive film of the present invention adheres to one of the electronic components but is not yet connected to the other electronic component (an intermediate component during the connection process; in other words, an anisotropic conductive film-adhering electronic component), the insulating particle-including conductive particles in the anisotropic conductive film have the same characteristics as the insulating particle-including conductive particles in the above-described connection structure.

An example of a method for connecting electronic components using the anisotropic conductive film can be as follows. In a case where the resin layer of the anisotropic conductive film is constituted by a single insulating resin layer 5, the anisotropic conductive film is temporarily pressure-bonded to the second electronic component, such as any of a variety of substrates, from the side on which the insulating particle-including conductive particles 3 are embedded into the surface. Next, the first electronic component, such as an IC chip, is positioned with the temporarily pressure-bonded anisotropic conductive film on the side on which the insulating particle-including conductive particles 3 are not embedded into the surface, and this is subjected to thermocompression bonding. The manufacture can be carried out in this manner. In a case where the insulating resin layer of the anisotropic conductive film contains not only a thermal polymerization initiator and a thermo-polymerizable compound, but also a photopolymerization initiator and a photopolymerizable compound (which may be the same as the thermo-polymerizable compound), a pressure-bonding method that uses both light and heat may be used. Doing so makes it possible to keep needless movement of the insulating particle-including conductive particles to a minimum. Additionally, the side in which the insulating particle-including conductive particles 3 are not embedded may be temporarily bonded to the second electronic component and used. Note that the anisotropic conductive film may be temporarily bonded to the first electronic component, rather than the second electronic component, and used.

Additionally, in a case where the resin layer in the anisotropic conductive film is formed from a layered body including the insulating resin layer 5 and the low-viscosity insulating resin layer 6, the insulating resin layer 5 may be temporarily pressure-bonded to the second electronic component, such as any of a variety of substrates, after which the first electronic component, such as an IC chip, is placed in alignment with the low-viscosity insulating resin layer 6 of the temporarily pressure-bonded anisotropic conductive film, and subjected to thermocompression bonding. The first electronic component may be temporarily bonded to the low-viscosity insulating resin layer 6 side of the anisotropic conductive film and used.

EXAMPLES

The present invention will be described in more detail below with reference to examples.

Examples 1-10

(1) Manufacture of Anisotropic Conductive Film

First, resin compositions forming insulating resin layers and low-viscosity insulating resin layers were respectively prepared with the formulas shown in Table 1.

The resin composition forming the insulating resin layer was applied to a PET film with a film thickness of 50 μm using a bar coater, and this was dried for 5 minutes in an oven at 80° C. to form an insulating resin layer on the PET film with the thicknesses indicated in Table 2. In the same manner, the low-viscosity insulating resin layer was formed on the PET film at the thicknesses indicated in Table 2.

Meanwhile, a mold was created so that the insulating particle-including conductive particles have the square lattice arrangement illustrated in FIG. 1A when viewed in plan view, with the inter-particle distance being equal to the particle diameter of the insulating particle-including conductive particles, and with a number density of 28000/mm². In other words, a mold in which the convex portion pattern of the mold (the number density of 28000/mm²) is a square lattice arrangement, the pitch of the convex portions in the lattice axis is twice the average particle diameter, and an angle θ formed by the lattice axis and the short-side direction of the anisotropic conductive film is 15° was created. Pellets of a known transparent resin were melted and poured into the mold, and then cooled and hardened, to form a resin mold in which the concave portions have the arrangement pattern illustrated in FIG. 1A.

Additionally, a mold in which the convex portion pattern (the number density of 28000/mm²) is random was created, and a resin mold in which the concave portions are in a random pattern was formed using that mold. At this time, the inter-conductive particle distance of adjacent insulating particle-including conductive particles was set to be greater than or equal to 0.5 times the average diameter of the conductive particles.

Insulating particle-including conductive particles were prepared by causing insulating microparticles based on the descriptions of JP 2014-132567 A (average particle diameter: 0.3 μm) to adhere to the surfaces of metal-coated resin particles (Sekisui Chemical Co., Ltd., AUL703, average particle diameter: 3 μm), and the insulating particle-including conductive particles were used to fill the concave portions of the resin mold. This was covered with the insulating resin layer described above.

In Examples 1 and 2, the insulating resin layer was pressed at 60° C. and at 0.5 MPa and the insulating resin layer was separated from the resin mold, and the insulating particle-including conductive particles transferred to the insulating resin layer as a result. At this time, cross section observation using a SEM indicated that the embedding percentage (Lb/D) of the insulating particle-including conductive particle with respect to the insulating resin layer was 30%. Additionally, no concavities were present around the insulating particle-including conductive particles in the surface of the insulating resin layer to which the insulating particle-including conductive particles were transferred (see FIG. 2). In Examples 7 to 10, the insulating particle-including conductive particles were transferred to the insulating resin layer in the same manner as in Examples 1 and 2, but the temperature used when pushing the insulating particle-including conductive particles into the insulating resin layer was set to be lower than 60° C. so that concavities were formed in the insulating resin layer, around the insulating particle-including conductive particles, after the transfer.

Next, in Examples 3 to 10, the insulating particle-including conductive particles were pressed onto the insulating resin layer, and the insulating particle-including conductive particles were pushed into the insulating resin layer at an embedding percentage (Lb/D) of 100%. The temperature and pressure used during this pushing were the same temperature and pressure described above, used when transferring the insulating particle-including conductive particles from the resin mold to the insulating resin layer. As a result, in Examples 3 to 6, no concavities are present in the insulating resin layer around the insulating particle-including conductive particles after the pushing. However, in Examples 7 to 10, concavities were formed in the insulating resin layer around the insulating particle-including conductive particles after the pushing (see FIG. 3A).

In Examples 1 and 2 (embedding percentage: 30%) and Examples 3 and 4 (embedding percentage: 100%), a low-viscosity insulating resin layer was laminated onto the surface of the insulating resin layer to which the insulating particle-including conductive particles were transferred, and an anisotropic conductive film was obtained as a result (see FIG. 5).

On the other hand, in Examples 5 to 10 (embedding percentage: 100%), the low-viscosity insulating resin layer was not laminated. Of these, in Examples 7 to 10, concavities were formed in the insulating resin layer around the insulating particle-including conductive particles in a state where the insulating particle-including conductive particles were pushed into the insulating resin layer. However, in Examples 9 and 10, the insulating resin layer having the concavities was thermally compressed, under conditions that did not interfere with the anisotropic conductive connection, to eliminate the concavities.

Comparative Examples 1 to 4

In Comparative Examples 1 to 4, insulating-coated conductive particles (coating film thickness: from 0.1 to 0.5 μm) in which the entire surfaces of metal-coated resin particles (Sekisui Chemical Co., Ltd., AUL703, average particle diameter: 3 μm) were given an insulating coating, were used instead of the insulating particle-including conductive particles in the above-described Examples. The above-described resin mold was filled so that the insulating-coated conductive particles took on the arrangement or disposition shown in Table 2, and the insulating-coated conductive particles were transferred to an insulating resin layer (embedding percentage: 30%). Furthermore, in Comparative Examples 3 and 4, the insulating-coated conductive particles transferred to the insulating resin layer were pushed into the insulating resin layer to achieve an embedding percentage of 100%. A low-viscosity insulating resin layer was then laminated onto the surface to which the insulating-coated conductive particles were transferred or pushed.

TABLE 1

| | | Example 1 | Example 2 | Example 3 | Example 4 | Example 5 (mass %) |
|---|---|---|---|---|---|---|
| Insulating resin layer | Phenoxy resin (YP-50, Nippon Steel & Sumikin Chemical Co., Ltd.) | 40 | 40 | 40 | 40 | 40 |
| | Silica filler (Aerosil R805, Aerosil Japan) | 25 | 25 | 25 | 25 | 15 |
| | Liquid epoxy resin (jER 828, Mistubishi Chemical Corporation) | 30 | 30 | 30 | 30 | 40 |
| | Silane coupling agent (KBM-403, Shin-Etsu Chemical Co., Ltd.) | 2 | 2 | 2 | 2 | 2 |
| | Thermal cationic polymerization initiator (SI-60L, Sanshin Chemical Industry Co., Ltd.) | 3 | 3 | 3 | 3 | 3 |
| Low-viscosity insulating resin layer | Phenoxy resin (YP-50, Nippon Steel & Sumikin Chemical Co., Ltd.) | 40 | 40 | 40 | 40 | — |
| | Silica filler (Aerosil R805, Aerosil Japan) | 5 | 5 | 5 | 5 | — |
| | Liquid epoxy resin (jER 828, Mistubishi Chemical Corporation) | 50 | 50 | 50 | 50 | — |
| | Silane coupling agent (KBM-403, Shin-Etsu Chemical Co., Ltd.) | 2 | 2 | 2 | 2 | — |
| | Thermal cationic polymerization initiator (SI-60L, Sanshin Chemical Industry Co., Ltd.) | 3 | 3 | 3 | 3 | — |

| | | Example 6 | Example 7 | Example 8 | Example 9 | Example 10 (mass %) |
|---|---|---|---|---|---|---|
| Insulating resin layer | Phenoxy resin (YP-50, Nippon Steel & Sumikin Chemical Co., Ltd.) | 40 | 40 | 40 | 40 | 40 |
| | Silica filler (Aerosil R805, Aerosil Japan) | 15 | 15 | 15 | 15 | 15 |
| | Liquid epoxy resin (jER 828, Mistubishi Chemical Corporation) | 40 | 40 | 40 | 40 | 40 |
| | Silane coupling agent (KBM-403, Shin-Etsu Chemical Co., Ltd.) | 2 | 2 | 2 | 2 | 2 |
| | Thermal cationic polymerization initiator (SI-60L, Sanshin Chemical Industry Co., Ltd.) | 3 | 3 | 3 | 3 | 3 |
| Low-viscosity insulating resin layer | Phenoxy resin (YP-50, Nippon Steel & Sumikin Chemical Co., Ltd.) | — | — | — | — | — |
| | Silica filler (Aerosil R805, Aerosil Japan) | — | — | — | — | — |
| | Liquid epoxy resin (jER 828, Mistubishi Chemical Corporation) | — | — | — | — | — |
| | Silane coupling agent (KBM-403, Shin-Etsu Chemical Co., Ltd.) | — | — | — | — | — |
| | Thermal cationic polymerization initiator (SI-60L, Sanshin Chemical Industry Co., Ltd.) | — | — | — | — | — |

| | | Comparative Example 1 | Comparative Example 2 | Comparative Example 3 | Comparative Example 4 (mass %) |
|---|---|---|---|---|---|
| Insulating resin layer | Phenoxy resin (YP-50, Nippon Steel & Sumikin Chemical Co., Ltd.) | 40 | 40 | 40 | 40 |
| | Silica filler (Aerosil R805, Aerosil Japan) | 25 | 25 | 25 | 25 |
| | Liquid epoxy resin (jER 828, Mistubishi Chemical Corporation) | 30 | 30 | 30 | 30 |
| | Silane coupling agent (KBM-403, Shin-Etsu Chemical Co., Ltd.) | 2 | 2 | 2 | 2 |
| | Thermal cationic polymerization initiator (SI-60L, Sanshin Chemical Industry Co., Ltd.) | 3 | 3 | 3 | 3 |
| Low-viscosity insulating resin layer | Phenoxy resin (YP-50, Nippon Steel & Sumikin Chemical Co., Ltd.) | 40 | 40 | 40 | 40 |
| | Silica filler (Aerosil R805, Aerosil Japan) | 5 | 5 | 5 | 5 |

TABLE 1-continued

| | | | | |
|---|---|---|---|---|
| Liquid epoxy resin (jER 828, Mistubishi Chemical Corporation) | 50 | 50 | 50 | 50 |
| Silane coupling agent (KBM-403, Shin-Etsu Chemical Co., Ltd.) | 2 | 2 | 2 | 2 |
| Thermal cationic polymerization initiator (SI-60L, Sanshin Chemical Industry Co., Ltd.) | 3 | 3 | 3 | 3 |

TABLE 2

| | | Example 1 | Example 2 | Example 3 | Example 4 | Example 5 |
|---|---|---|---|---|---|---|
| | Conductive particles | Insulating particle-including conductive particles | ← | ← | ← | ← |
| | Presence or absence of pushing of conductive particles into insulating resin layer | Absent | Absent | Present | Present | Present |
| | Particle arrangement | Square lattice | Random | Square lattice | Random | Square lattice |
| | Number of insulating particles in insulating particle-including conductive particles in anisotropic conductive film | NA4, NA3 > NA2 > NA1 | ← | NA4, NA3 > NA2 >> NA1 | ← | ← |
| | Embedding percentage (%) | 30% | 30% | 100% | 100% | 100% |
| Thickness (μm) | Insulating resin layer | 4 | 4 | 4 | 4 | 18 |
| | Low-viscosity insulating resin layer | 14 | 14 | 14 | 14 | — |
| Viscosity (Pa · s) | Insulating resin layer | 5000 | 5000 | 5000 | 5000 | 2000 |
| | Low-viscosity insulating resin layer | 800 | 800 | 800 | 800 | — |
| electrical conduction resistance (Ω) | Initial conduction resistance | A | A | A | A | A |
| | Conduction reliability (85° C., 85% RH, 500 hr) | A | A | S | S | A |
| | Short-circuit occurrence rate (ppm) | A | A | A | A | A |
| | Conductive particle capturing performance | OK | OK | OK | OK | OK |

| | | Example 6 | Example 7 | Example 8 | Example 9 | Example 10 |
|---|---|---|---|---|---|---|
| | Conductive particles | ← | ← | ← | ← | ← |
| | Presence or absence of pushing of conductive particles into insulating resin layer | Present | Present | Present | Present | Present |
| | Particle arrangement | Random | Square lattice | Random | Square lattice | Random |
| | Number of insulating particles in insulating particle-including conductive particles in anisotropic conductive film | ← | ← | ← | ← | ← |
| | Embedding percentage (%) | 100% | 100% | 100% | 100% | 100% |
| Thickness (μm) | Insulating resin layer | 18 | 18 | 18 | 18 | 18 |
| | Low-viscosity insulating resin layer | — | — | — | — | — |
| Viscosity (Pa · s) | Insulating resin layer | 2000 | 2000 | 2000 | 2000 | 2000 |
| | Low-viscosity insulating resin layer | — | — | — | — | — |
| electrical conduction resistance (Ω) | Initial conduction resistance | A | A | A | A | A |
| | Conduction reliability (85° C., 85% RH, 500 hr) | A | A | A | A | A |
| | Short-circuit occurrence rate (ppm) | A | A | A | A | A |
| | Conductive particle capturing performance | OK | OK | OK | OK | OK |

TABLE 2-continued

|  |  | Comparative Example 1 | Comparative Example 2 | Comparative Example 3 | Comparative Example 4 |
|---|---|---|---|---|---|
| Conductive particles | | Insulating-coated conductive particles | ← | ← | ← |
| Presence or absence of pushing of conductive particles into insulating resin layer | | Absent | Absent | Present | Present |
| Particle arrangement | | Square lattice | Random | Square lattice | Random |
| Number of insulating particles in insulating particle-including conductive particles in anisotropic conductive film | | — | — | — | — |
| Embedding percentage (%) | | 30% | 30% | 100% | 100% |
| Thickness (μm) | Insulating resin layer | 4 | 4 | 4 | 4 |
|  | Low-viscosity insulating resin layer | 14 | 14 | 14 | 14 |
| Viscosity (Pa · s) | Insulating resin layer | 5000 | 5000 | 5000 | 5000 |
|  | Low-viscosity insulating resin layer | 800 | 800 | 800 | 800 |
| electrical conduction resistance (Ω) | Initial conduction resistance | B | B | B | B |
|  | Conduction reliability (85° C., 85% RH, 500 hr) | C | C | C | C |
| Short-circuit occurrence rate (ppm) | | A | A | A | A |
| Conductive particle capturing performance | | OK | OK | OK | OK |

(2) Disposition of Particles (2-1) Percentage of Independent Particles

Using a scanning electron microscope (SEM), 100 insulating particle-including conductive particles or insulating-coated conductive particles were observed in the front and rear surfaces of the anisotropic conductive films of the Examples and the Comparative Examples (for films on which a low-viscosity insulating resin layer was laminated, the low-viscosity insulating resin layer-side surface and the surface opposite therefrom). The number of insulating particle-including conductive particles or insulating-coated conductive particles not in contact with each other was measured, and the ratio of that number to the total number (i.e., the percentage of independent particles) was found. As a result, the percentage of independent particles was greater than 99% in both the examples and the comparative examples.

(2-2) Insulating Particle Coverage Rate

The insulating particle coverage rate was found for the insulating particle-including conductive particles used to manufacture the anisotropic conductive films of the Examples (the insulating particle-including conductive particles before being embedded into the insulating resin layer). 100 of the insulating particle-including conductive particles were observed using a scanning electron microscope (SEM), and the number of insulating particles per single conductive particle was measured for each of the insulating particle-including conductive particles. The insulating particle coverage rate was then calculated from the measured number, the surface area of one insulating particle-including conductive particle when viewed in plan view, and the surface area of one insulating particle when viewed in plan view. As a result, the insulating particle coverage rate was 67% in the insulating particle-including conductive particles used to manufacture the anisotropic conductive film.

(2-3) Coverage State of Insulating Particles after Manufacture of Anisotropic Conductive Film The coverage state of the insulating particles in the insulating particle-including conductive particles distributed throughout the anisotropic conductive films of the examples was found by observing cross sections using a scanning electron microscope (SEM). In this cross section observation, 100 insulating particle-including conductive particles were measured, and magnitude relationships between the numbers of the insulating particles in the areas A1, A2, A3, and A4 illustrated in FIG. 2, i.e., $N_{A1}$, $N_{A2}$, $N_{A3}$, and $N_{A4}$, were examined. This showed no particular difference in the numbers of the insulating particles between area A3 and area A4 in each of the examples. Compared to Example 1, in Examples 3 to 10, the number of insulating particles in area A1 was markedly lower than the number of insulating particles in area A2.

(3) Evaluation

The anisotropic conductive films of the examples and the comparative examples were cut to a surface area sufficient for connection and evaluation. Then, the cut anisotropic conductive films were used to measure and evaluate (a) initial conduction resistance, (b) conduction reliability, (c) short-circuit occurrence rate, and (d) conductive particle capturing performance, as will be described below. Results are shown in Table 2.

(a) Initial Conduction Resistance

The anisotropic conductive film of each of the examples and the comparative examples was sandwiched between conduction property IC for evaluation and a glass substrate and thermally compressed (180° C., 60 MPa, 5 seconds) so as to obtain each of connected objects for evaluation. The conduction resistance of each connected object for evaluation was measured, and the measured initial conduction resistance was evaluated according to the following criteria.

A: less than or equal to 0.3Ω
B: greater than 0.3Ω and less than or equal to 0.4Ω
C: greater than 0.4Ω

A score of B indicates suitability for practical use. A score of A is more preferable.

Here, the terminal patterns of the IC for evaluation and the glass substrate corresponded to each other, and sizes thereof were as described below. In addition, when connecting the IC for evaluation and the glass substrate, the long-side direction of the anisotropic conductive film and the short-side direction of the bumps were aligned.

Conduction Property IC for Evaluation
  Outer shape: 1.8×20.0 mm
  Thickness: 0.5 mm
  Bump specifications: size: 30×85 µm; distance between bumps: 50 µm; bump height: 15 µm Glass Substrate
  Glass material: 1737F manufactured by Corning Inc.
  Outer size: 30×50 mm
  Thickness: 0.5 mm
  Electrode: ITO wiring (b) Conduction Reliability The connected object for evaluation produced in (a) was placed in a thermostatic chamber for 500 hours at a temperature of 85° C. and a humidity of 85% RH, and then the conduction resistance was measured in the same manner as in the case of the initial conduction resistance. The measured conduction resistance was evaluated according to the following criteria.
  S: less than or equal to 3.0Ω
  A: greater than 3.0Ω and less than or equal to 4.0Ω
  B: greater than 4.0Ω and less than or equal to 6.0Ω
  C: greater than 6.0Ω

A score of B indicates suitability for practical use. A score of A or higher is even more preferable.

(c) Short-Circuit Occurrence Rate

The anisotropic conductive films of the examples and the comparative examples were sandwiched between an insulative property test IC for evaluation (a comb-tooth TEG (test element group) having 7.5-µm spaces) and a glass substrate having a corresponding terminal pattern, and were subjected to the same thermal compression as with the initial conduction resistance to obtain a connected object for evaluation. The short-circuit occurrence rate in the connected object for evaluation was then measured using a digital multimeter (Digital Multimeter 7561, Yokogawa Test & Measurement Corporation). The specifications of the insulative property test IC for evaluation are indicated below.

Insulative Property Test IC for Evaluation
  Dimensions: 1.5×13 mm
  Thickness: 0.5 mm
  Bump specifications: gold-plated; size: 25×140 µm; distance between bumps: 7.5 µm; bump height: 15 µm The measured short-circuit occurrence rate was evaluated according to the following criteria.
  A: less than 50 ppm
  B: greater than or equal to 50 ppm and less than or equal to 200 ppm
  C: greater than 200 ppm A score of B indicates suitability for practical use.

(d) Conductive Particle Capturing Performance

Using an IC for evaluating conductive particle capturing performance, the IC for evaluation and an ITO-coated substrate having a corresponding terminal pattern were thermally compressed (180° C., 60 MPa, 5 seconds) while shifting the alignment by 6 µm at a time. The number of captured conductive particles was measured for 100 areas of 6 µm×66.6 µm where the bump of the IC for evaluation and the terminal of the substrate overlap, and the minimum number of captured particles was found and evaluated in accordance with the following criteria.

IC for Evaluating Conductive Particle Capturing Performance
  Outer shape: 1.6×29.8 mm
  Thickness: 0.3 mm
  Bump specifications: size: 12×66.6 µm; bump pitch: 22 µm (L/S=12 µm/10 µm); bump height: 12 µm Conductive Particle Capturing Performance Evaluation Criteria
  Pass: 3 or more
  Fail: less than 3

In Table 2, with the anisotropic conductive film of Examples 1 to 10, the number density of the insulating particles in the insulating particle-including conductive particles is lower in areas A2 and A1 than in areas A3 and A4. In particular, in Examples 3 to 10, in which the insulating particle-including conductive particles were pushed into the insulating resin layer when manufacturing the anisotropic conductive film, the number density of the insulating particles is markedly lower in area A1 than in area A2. It can therefore be seen that the number density of the insulating particles 2 in the areas A2 and A1, where insulating particles 2 make contact with the particles with respect to the film thickness direction, is even lower than the number density of insulating particles 2 that make contact with the conductive particles 1 with respect to the film planar direction in the areas A3 and A4, and that Examples 3 and 4 provide better conduction reliability than Examples 1 and 2. As opposed to this, the conduction reliability was poor in Comparative Examples 1 to 4, which used resin-coated conductive particles.

According to the results indicated in Table 2, comparisons between Examples 1 and 2, between Examples 3 and 4, between Examples 5 and 6, between Examples 7 and 8, between Examples 9 and 10, between Comparative Examples 1 and 2, and between Comparative Examples 3 and 4 indicate no difference between a case where the insulating particle-including conductive particles are arranged in a square lattice and a case where the insulating particle-including conductive particles are disposed at random, and between a case where the insulating-coated conductive particles are arranged in a square lattice and a case where the insulating-coated conductive particles are disposed at random, with respect to the conduction resistance, the short-circuit occurrence rate, and the conductive particle capturing performance. However, when evaluating the capturing performance, indentations were easier to confirm when the insulating particle-including conductive particles or the insulating-coated conductive particles were arranged in a square lattice than when disposed at random.

Note that Examples 5 and 6, in which there are no concavities in the insulating resin layer around the insulating particle-including conductive particle, Examples 7 and 8, in which there are concavities in the insulating resin layer around the insulating particle-including conductive particle, and Examples 9 and 10, in which the concavities have been eliminated through thermal compression, were all evaluated favorably in terms of the initial conduction resistance, the conduction reliability, the short-circuit occurrence rate, and the conductive particle capturing performance. Accordingly, it can be seen that in these Examples, the insulating particle-including conductive particle did not needlessly move due to the flow of resin, regardless of whether the concavities were present.

REFERENCE SIGNS LIST

1 Conductive particle
2 Insulating particle

3 Insulating particle-including conductive particle
5 Insulating resin layer
5a Surface of insulating resin layer
5b Concavity (inclination)
5c Concavity (undulation)
5p Tangent plane
6 Low-viscosity insulating resin layer
7 Release film
10A, 10B, 10C, 10D Anisotropic conductive film
30 Transfer mold
31 Concave portion
32 Flat plate
33 Flat plate or roller
A Lattice axis
A1, A2, A3, A4 Area
D Particle diameter of insulating particle-including conductive particles
La layer thickness of insulating resin layer
Lb Distance from surface near insulating particle-including conductive particle to deepest part of insulating particle-including conductive particle
Lc Diameter of exposed part (directly above) insulating particle-including conductive particle at inclinations or undulations
Ld Maximum diameter of inclinations or undulations in insulating resin layer around or directly above insulating particle-including conductive particles
Le Maximum depth of inclinations in insulating resin layer around insulating particle-including conductive particles
Lf Maximum depth of undulations in insulating resin layer directly above insulating particle-including conductive particles
$N_{A1}$, $N_{A2}$, $N_{A3}$, $N_{A4}$ Number of insulating particles present in area
θ Angle formed by long-side direction of terminal and lattice axis

The invention claimed is:

1. An anisotropic conductive film comprising: insulating particle-including conductive particles, in which insulating particles adhere to the surfaces of conductive particles, the insulating particle-including conductive particles being distributed throughout an insulating resin layer,
wherein in the insulating particle-including conductive particles, a number of the insulating particles in contact with the conductive particles with respect to a film thickness direction is lower than a number of the insulating particles in contact with the conductive particles with respect to a film planar direction, and
wherein the numbers are based on the average of all of the insulating particle-including conductive particles in the anisotropic conductive film.

2. The anisotropic conductive film according to claim 1, wherein a number of the insulating particles overlapping with the conductive particles when one of a front and rear film surface of the anisotropic conductive film is viewed in plan view is lower than a number of the insulating particles overlapping with the conductive particles when the other of the film surfaces is viewed in plan view.

3. The anisotropic conductive film according to claim 1, wherein the insulating particle-including conductive particles are disposed without being in contact with each other.

4. The anisotropic conductive film according to claim 1, wherein a low-viscosity insulating resin layer having a lower minimum melt viscosity than the insulating resin layer is laminated onto the insulating resin layer.

5. The anisotropic conductive film according to claim 4, wherein the insulating particle-including conductive particles are present between the insulating resin layer and the low-viscosity insulating resin layer.

6. The anisotropic conductive film according to claim 5, wherein a number of insulating particles on the conductive particles when a low-viscosity insulating resin layer-side film surface is viewed in plan view is lower than a number of insulating particles on the conductive particles when an insulating resin layer-side film surface is viewed in plan view.

7. The anisotropic conductive film according to claim 1, wherein when a distance from the one of front and rear surfaces of the insulating resin layer that is closer to the insulating particle-including conductive particles, to a deepest part of the insulating particle-including conductive particles, is represented by Lb, and a particle diameter of the insulating particle-including conductive particles is represented by D, a ratio between the distance Lb and the particle diameter D (Lb/D) is from 30 to 105%.

8. The anisotropic conductive film according to claim 1, wherein a surface of the insulating resin layer near the insulating particle-including conductive particles includes inclinations or undulations relative to a tangent plane of the insulating resin layer, to a central portion of the insulating resin layer between adjacent ones of the insulating particle-including conductive particles.

9. The anisotropic conductive film according to claim 8, wherein at the inclinations, the surface of the insulating resin layer near the insulating particle-including conductive particle is absent with respect to the tangent plane, and at the undulations, an amount of resin in the insulating resin layer directly above the insulating particle-including conductive particles is lower than when the surface of the insulating resin layer directly above the insulating particle-including conductive particles corresponds to the tangent plane.

10. A method for manufacturing a connection structure, the method comprising making an anisotropic conductive connection between electronic components using the anisotropic conductive film according to claim 1.

11. A connection structure in which an anisotropic conductive connection is made between electronic components using the anisotropic conductive film according to claim 1.

12. A connection structure comprising: terminals of opposing electronic components that are anisotropic conductively connected by insulating particle-including conductive particles and an insulating resin layer,
wherein the insulating particle-including conductive particles not held between the opposing terminals include insulating particle-including conductive particles having an insulating particle-lacking area facing in the direction in which the terminals oppose each other.

13. The anisotropic conductive film according to claim 1, wherein the insulating particle-including conductive particles are aligned in the film thickness direction.

* * * * *